United States Patent
Watanabe

(10) Patent No.: US 8,350,572 B2
(45) Date of Patent: Jan. 8, 2013

(54) IONIZATION VACUUM DEVICE

(75) Inventor: Fumio Watanabe, Tsukuba (JP)

(73) Assignee: Ampere Inc., Tokyo (JP)

( * ) Notice: Subject to any disclaimer, the term of this patent is extended or adjusted under 35 U.S.C. 154(b) by 1107 days.

(21) Appl. No.: 12/230,968

(22) Filed: Sep. 9, 2008

(65) Prior Publication Data

US 2009/0134018 A1    May 28, 2009

(30) Foreign Application Priority Data

Nov. 27, 2007   (JP) ................................ 2007-305526

(51) Int. Cl.
*G01L 21/30* (2006.01)

(52) U.S. Cl. ......... 324/460; 324/463; 324/468; 324/459

(58) Field of Classification Search .......... 324/459–470; 204/298.03
See application file for complete search history.

(56) References Cited

U.S. PATENT DOCUMENTS

| | | | | |
|---|---|---|---|---|
| 3,580,052 | A * | 5/1971 | Young | 73/40.7 |
| 4,565,969 | A * | 1/1986 | Olson et al. | 324/468 |
| 4,636,680 | A * | 1/1987 | Bills et al. | 313/7 |
| 5,198,772 | A * | 3/1993 | Peacock et al. | 324/463 |
| 6,500,321 | B1 * | 12/2002 | Ashtiani et al. | 204/298.12 |
| 7,049,823 | B2 * | 5/2006 | Correale | 324/460 |
| 7,132,039 | B2 * | 11/2006 | Anazawa et al. | 204/173 |
| 7,795,876 | B2 * | 9/2010 | Wetzig et al. | 324/460 |
| 7,922,880 | B1 * | 4/2011 | Pradhan et al. | 204/298.06 |
| 2005/0103620 | A1 * | 5/2005 | Chistyakov | 204/192.12 |
| 2007/0026166 | A1 * | 2/2007 | Gomi | 428/1.1 |
| 2008/0018337 | A1 * | 1/2008 | Carmichael et al. | 324/460 |
| 2008/0048663 | A1 * | 2/2008 | Hong et al. | 324/464 |

FOREIGN PATENT DOCUMENTS

| | | |
|---|---|---|
| JP | 35-016136 | 10/1958 |
| JP | 52-026259 | 2/1977 |
| JP | 60-534 | 1/1985 |
| JP | 05-290792 | 11/1993 |
| JP | 07-005061 | 1/1995 |
| JP | 07-055735 | 3/1995 |
| JP | 07-072030 | 3/1995 |
| JP | 314478 | 8/1995 |
| JP | 11-086777 | 3/1999 |
| JP | 2000-039375 | 2/2000 |
| JP | 2003-178669 | 6/2003 |

* cited by examiner

*Primary Examiner* — Jermele M Hollington
*Assistant Examiner* — Alesa Allgood
(74) *Attorney, Agent, or Firm* — Bacon & Thomas, PLLC

(57) ABSTRACT

An ionization vacuum device measures a pressure in a vacuum vessel, and has: an anode provided inside the vacuum vessel; a cathode provided inside the vacuum vessel; a power source for discharge that supplies electric power for discharge between the anode and the cathode; a power source for cathode-heating that supplies power for heating to the cathode, means for forming a magnetic field in a space between the anode and the cathode; control means for controlling so as to heat said cathode by said power source for cathode-heating while discharge of gas inside said vacuum vessel is caused, and so as to maintain the temperature of said cathode within a temperature range where thermonic electrons are not emitted from said cathode.

16 Claims, 13 Drawing Sheets

IONIZATION VACUUM DEVICE

CROSS-REFERENCE TO RELATED APPLICATIONS

This application is based on and claims priority of Japanese Patent Application No. 2007-305526 filed on Nov. 27, 2007, the entire contents of which are incorporated herein by reference.

BACKGROUND OF THE INVENTION

1. Field of the Invention

The present invention relates to an ionization vacuum device used as a cold cathode ionization vacuum gauge that measures a pressure of residual gas molecules that exist in vacuum vessel by using a vacuum discharge phenomenon in magnetic field.

2. Description of the Related Art

Conventionally, in a cold cathode ionization vacuum gauge using magnetic field, several kV to 7 kV of direct current high voltage is applied basically between an anode and a cathode arranged in a vacuum vessel and a pressure is measured by using the fact that the discharge current is approximately proportional to a pressure inside the vacuum vessel. Since the discharge current becomes weaker and it becomes impossible to sustain discharge when the pressure becomes lower, a structure is taken that a magnetic field is given to a space between two electrodes to extend an electron pass length and thus prevent diffusion of electrons. A vacuum gauge having this structure using the magnetic field is also called a Penning vacuum gauge because Penning put into practical use for the first time in 1937, a two-electrode constitution where the magnetic field exists is called a Penning Cell, and discharge that occurs in this constitution is called a Penning discharge. Further, the vacuum gauge is also called a cold cathode ionization vacuum gauge because it does not use a hot cathode filament.

Penning vacuum gauges described in Patent Document (Japanese Patent No. 314478, Japanese Laid-open Patent Publications No.Hei11-86777 (Patent No. 3750767), No.Hei7-55735 and No.Hei5-290792) are known. According to these basic operating principles, electrons are confined in a magnetic-field-to-electric-field orthogonal space formed by an anode and a cathode by the work of magnetic field, ions are generated by collision of generated electron cloud and gas molecules, and a pressure is measured by measuring ion current.

As described, since the cold cathode ionization vacuum gauge is a method of effectively using electrons generated from gas molecules by discharge, the above-mentioned hot cathode filament is unnecessary, there is no fear of filament burnout. It is preferably used in a field or a production site where stability is required for long period of time.

Further, since various researchs revealed that the cold cathode ionization vacuum gauge had very large pumping speed, proposal of utilizing it as a vacuum pump was also made (Japanese Patent No.314478).

Meanwhile, in recent vacuum devices, electric components formed of organic insulating materials, such as a vacuum motor, a solenoid and a position detector are attached inside a vacuum vessel. Thus, for example, siloxane is emitted from the organic insulating materials such as silicon rubber. Further, phtalic acid, adipic acid or the like that is added as a plasticizer of thermoplastic resin is emitted in vapor from organic mechanical components. They result in contamination of a vacuum gauge and a pump. In the case of using such a cold cathode ionization vacuum gauge and pump, there occurs a problem that discharge stops in about one day in the worst case. When contaminating molecules fly into the cold cathode ionization vacuum gauge, the contaminating molecules are decomposed and ionized by suffering electron impact, and reach a cathode in cations. Contaminating materials (decomposed molecules) that reached the cathode receive electrons into a neutral state, but they are in a radical state. Therefore, they cause polymerization reaction with contaminating materials flying one after another into polymer, and then the polymer is deposited on a cathode surface to form coating through which electricity is hard to pass. This makes cations flying later to flow into the cathode less easily, and thus there occurs a problem of reducing gauge sensitivity, that is, discharge intensity or the like. Further, as a pump, there occurs a problem that sputtering of cathode is suppressed to cause reduction of pumping performance of the pump or increase of gas emission.

Furthermore, if the coating becomes thicker, there occurs a problem that the coating causes stop of discharge or prevention of activation (for start) of discharge in the worst case.

SUMMARY OF THE INVENTION

It is an object of the present invention to provide an ionization vacuum device capable of protecting a cathode from contaminating materials inside a vacuum vessel.

According to one aspect of the present invention, there is provided an ionization vacuum device having: a vacuum vessel; an anode provided inside said vacuum vessel; a cathode provided inside said vacuum vessel; a power source for discharge that supplies electric power for discharge between said anode and said cathode; a power source for cathode-heating that supplies power for heating to said cathode; and means for forming a magnetic field in a space between said anode and said cathode, in which said vacuum vessel is connected to another vacuum vessel to measure a pressure inside the another vacuum vessel, and wherein the device further has: control means for controlling so as to heating said cathode by said power source for cathode-heating while discharge of gas inside said vacuum vessel is caused, and so as to maintain the temperature of said cathode within a temperature range where thermonic electrons are not emitted from said cathode.

Since the cathode is heated, even if contaminating materials such as organic materials fly into to attach on the cathode, they can be quickly separated from the electrode surface of the cathode.

Further, since the temperature is suppressed to a temperature or less at which thermonic electrons are not generated from the cathode, thermonic electrons are not emitted from the cathode, so that it becomes possible to measure a discharge current without disturbing a discharge phenomenon that is caused by regular two electrodes of anode and cathode. Thus, stable and highly reliable pressure measurement or pumping can be performed for a long period of time without suffering from contamination.

DESCRIPTION OF THE PREFERRED EMBODIMENTS

Figure 1:
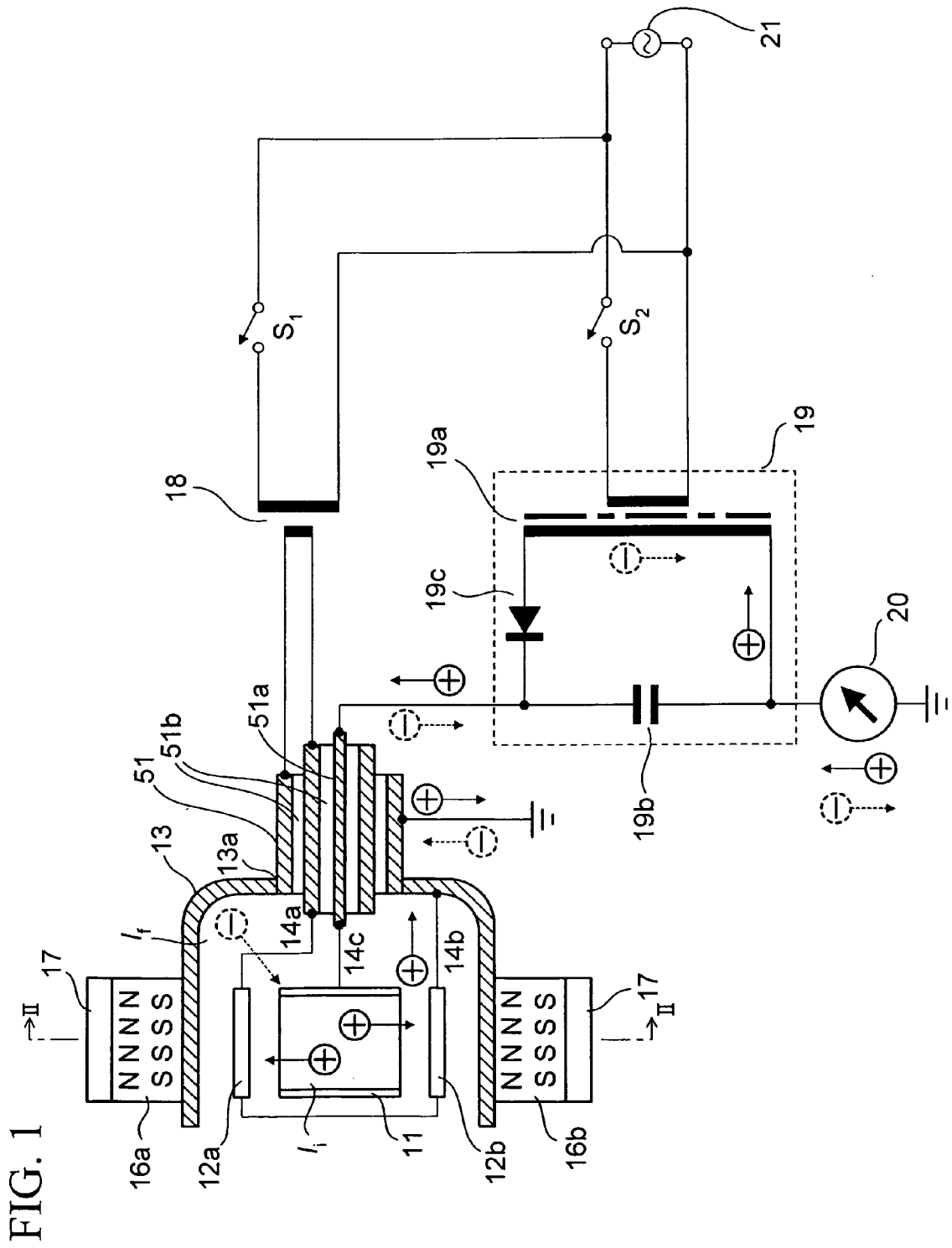
FIG. 1 is a typical view showing a structure of an ionization vacuum device according to the first embodiment of the present invention.

In the following, description will be made for embodiments of the present invention referring to the drawings.

First Embodiment

Figure 2:
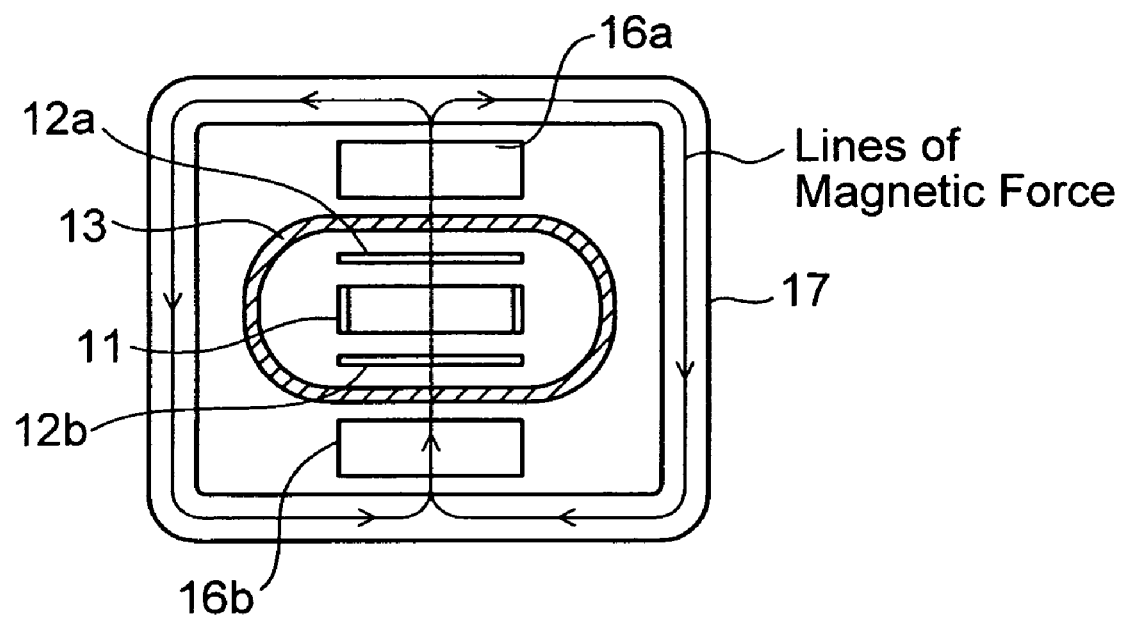
FIG. 2 is a cross-sectional view taken along line II-II of FIG. 1.

FIG. 1 is the schematic view of a single cell type ionization vacuum device according to the first embodiment of the present invention. The ionization vacuum device can be used as a Penning type sputter-ion pump as well as a cold cathode ionization vacuum gauge. FIG. 2 is the cross-sectional view taken along line II-II of FIG. 1.

In the ionization vacuum device of the first embodiment shown in FIG. 1, Penning Cell is housed in a vacuum vessel 13. The ionization vacuum device has a flange (not shown), and is intended to be attached via the flange to a vacuum vessel (vacuum vessel to be exhausted) of a vacuum treatment device that performs treatment in vacuum.

In the Penning Cell, a cylindrical anode 11 is arranged in the vacuum vessel 13 that is formed of a non-magnetic material, and plate-shaped cathodes (12a, 12b) are arranged so as to face two opening ends of the cylinder of the anode 11 and sandwich the anode 11 from above and below.

The vacuum vessel 13 has an opening portion, and a cylindrical-shaped high voltage triaxial vacuum feedthrough 51 is inserted into the opening portion so as to be coaxial thereto. The high voltage triaxial vacuum feedthrough 51 is constituted of two inner and outer coaxial cylinders and a terminal 51a arranged at the very center of the inner cylinder, and they are insulated from each other by a ceramics 51b and hermetically sealed so that the interior can be kept in vacuum. The vacuum vessel 13 is welded to the outer cylinder of the high voltage triaxial vacuum feedthrough 51, and the vacuum vessel 13 is grounded.

Outside the above-described vacuum vessel 13, there are arranged permanent magnets (16a, 16b) for generating a magnetic field in the cylinder of the anode 11 sandwiched between the cathodes (12a, 12b). The magnetic field is parallel with the axis of the cylinder.

Outside the permanent magnets (16a, 16b), a yoke 17 of ferromagnet is arranged to form a closed magnetic circuit coupling the permanent magnets (16a, 16b). The closed magnetic circuit is formed in the route of the permanent magnet 16b on the lower portion→(the vacuum vessel 13, cathode 12b on the lower portion, the anode 11, cathode 12a on the upper portion, the vacuum vessel 13)→the permanent magnet 16a on the upper portion→the yoke 17→the permanent magnet 16b on the lower portion as shown in FIG. 2A.

The anode 11 of the Penning Cell is connected to the output terminal of a plus pole (positive pole) of a high-voltage DC power source (power source for discharge) 19. The output terminal of a minus pole (negative pole) of the high-voltage DC power source 19 is grounded via an electrometer 20 for measuring a discharge current. Wiring 14c is connected from the anode 11 to the high-voltage DC power source 19 through the terminal 51a of the high voltage triaxial vacuum feedthrough 51. A positive DC voltage of 2 to 5 kV is usually applied from the high-voltage DC power source 19 to the anode 11.

One end of the cathode 12a on the upper portion is connected to one output terminal of a power source 18 for heating, which supplies AC electric power, by wiring 14a via the inner cylinder of the high voltage triaxial vacuum feedthrough 51, and one end of the cathode 12b on the lower portion is connected to the vacuum vessel 13 by wiring 14b, and then is further extended from the vacuum vessel 13 to be connected to the other output terminal of the power source 18 for heating. The other ends of the cathode 12a on the upper portion and the cathode 12b on the lower portion are connected to each other inside the vacuum vessel 13 by wiring. Consequently, the cathode 12a on the upper portion and the cathode 12b on the lower portion are connected in series to the power source 18 for heating.

Since the cathode 12a on the upper portion and the cathode 12b on the lower portion are connected in series to the power source 18 for heating, supply of AC electric power from the power source 18 for heating to the cathode 12a on the upper portion and the cathode 12b on the lower portion allows the electric resistance of the cathodes (12a, 12b) to consume electric power, and the cathodes (12a, 12b) themselves generate heat.

Furthermore, although not shown, the device is equipped with a controller (control means) such as a micro computer that controls heating by the power source 18 for heating so as to maintain the surface temperature of the cathodes (12a, 12b) within a temperature range of 200° C. or more and where emission of thermonic electrons does not occur from the cathodes (12a, 12b). Note that heating by the power source 18 for heating can be also controlled manually instead of depending on a controller such as the microcomputer.

The reason of setting the lower limit of heating temperature to 200° C. is as follows. That is, it is confirmed through experiments that adsorption of residual gas molecules and contaminating materials to cathodes, which causes a measurement error, is reduced particularly in a range exceeding 200° C. to 500° C.

In the case where the temperature of the cathodes (12a, 12b) is elevated to emit thermonic electrons, there occurs a microwave generating phenomenon such as that in a magnetron oscillator used in a microwave oven to become a hot cathode type ionization gauge such as a hot cathode magnetron vacuum gauge.

As a material of the cathodes (12a, 12b), a conductive material having relatively high resistance is used. In the case of attaching importance to a function as the cold cathode ionization vacuum gauge and when corrosion resistant property is taken into consideration, an applicable conductive material is, for example, any one of platinum, iridium, and alloy containing at least any one of them, a conductive oxide such as sintered matrix of rhenium oxide and lantan cromate oxide, and or a non-metal conductor such as graphite. In the case of allowing to fullfil mainly a function as a sputter-ion pump and to be supported by a function as the cold cathode ionization vacuum gauge, titanium, tantalum, hafnium, zirconium or the like can be used. Note that a material same as that of the cathodes (12a, 12b) can be used as a material of the anode 11. Furthermore, an applicable metal material of corrosion resistant property may be nickel alloy such as Inconel (trade mark) and Hastelloy. Specifically, materials usable for the anode 11 and the cathodes (12a, 12b) are not limited to the metals listed here, but may be any material as long as they are an electric conductor and can be used in non-magnetic vacuum.

Next, description will be made for the constitutions of the power source 18 for heating and the high-voltage DC power source 19.

The power source 18 for heating and the high-voltage DC power source 19 are constituted of a power source circuit including a step-down transformer and a power source circuit including another step-up transformer. The power source circuits are connected to two pairs of wirings that are split into two from one AC source 21, respectively. The power source 18 for heating is constituted of a step-down transformer, where one branch wiring is connected to the primary side of the step-down transformer via a switch $S_1$. Further, the high-voltage DC power source 19 is constituted of a step-up transformer 19a, where the other branch wiring is connected to the primary side of the step-up transformer 19a via a switch $S_2$, a capacitor 19b connected to the secondary side of the step-up transformer 19a in parallel with the step-up transformer 19a, and a rectifying diode 19c serially inserted between the step-up transformer 19a and the capacitor 19b. The step-up transformer 19a is highly electrostatic shielded. This prevents a leakage current from being flowed into an electrometer 20 in case the leakage current from the AC power source occurs.

Next, description will be made for the operation of the ionization vacuum device of the above-described constitution.

In the above-described ionization vacuum device, by applying a DC voltage between the anode 11 and the cathodes (12a, 12b) and using magnetic field B in the state where the surface temperature of the cathodes (12a, 12b) is maintained within a temperature range of 200° C. or more and where emission of thermonic electrons does not occur from the cathodes (12a, 12b), sustainable discharge is generated in a cylinder of the anode 11 between the cathodes (12a, 12b). Then, while being allowed to function as a sputter-ion pump, a pressure in the vacuum vessel 13 is measured by measuring the discharge current $I_i$.

Because of the discharge, a part of gas molecules is ionized to generate ions and electrons in the cylinder of the anode 11 sandwiched between the cathodes (12a, 12b). Since ions are heavy, they are not affected by the magnetic field so much, but drawn to the cathodes (12a, 12b) by the electric field created between the anode 11 and the cathodes (12a, 12b).

On the surface of the cathodes (12a, 12b), the ions performs charge exchange to cause a flow of a current as a plus current in arrow directions attached with +symbols shown in solid lines in the circuit. In contrast, electrons are confined in a space by the function of the magnetic field to reach anode 11 less easily, then they are accumulated in the space like cloud (referred to as electron cloud). Of course, a part of electrons takes excessive energy to flow into the anode 11, but it is only a slight amount.

In this manner, it becomes possible to measure a vacuum pressure by mainly measuring the ion current $I_i$.

Figure 6A:
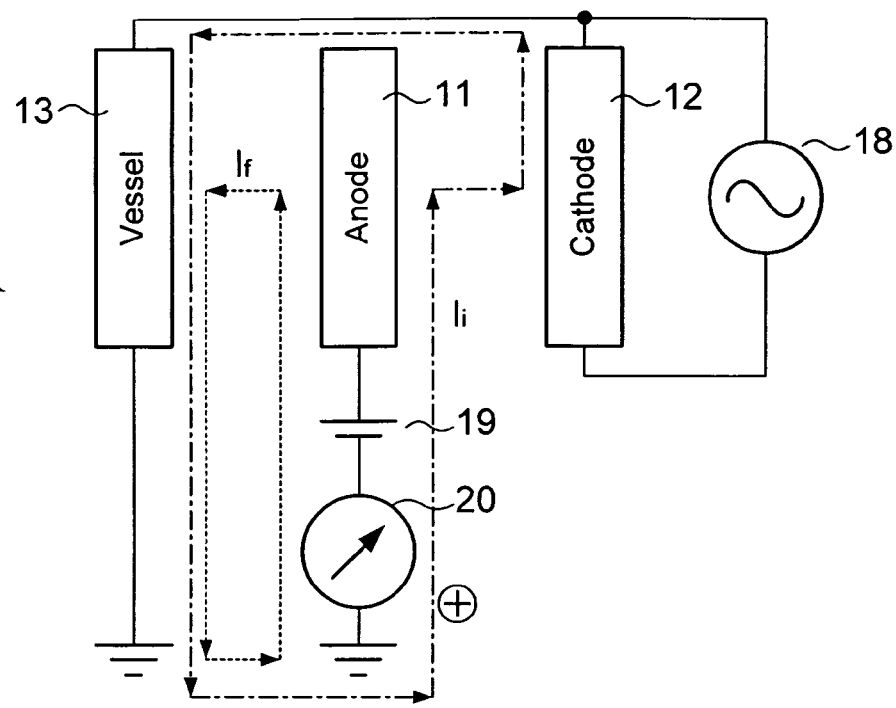
FIG. 6A is an equivalent circuit diagram of FIG. 1.

Note that there are electrons bursting not only from the cathodes (12a, 12b) but from the wall of the vacuum vessel 13 due to a strong electric field, and some of the electrons do not form the electron cloud but directly flow further into the anode 11. They are called a field emission current $I_f$, and in FIG. 1, the electron flow is shown in dashed lines (flowing in arrow directions attached with −symbols). FIG. 6A is an equivalent circuit of FIG. 1. In FIG. 6A, reference numeral 12 denotes an entire cathode that is constituted by connecting the cathodes (12a, 12b) in series.

According to the measurement circuit of FIG. 1 and FIG. 6A, the electrometer 20 performs measurement including both of the current $I_i$ based on ions and the current $I_f$ based on electrons. Since the field emission current $I_f$ becomes measurable in a ultra high vacuum range, the lower limit of a pressure measurable by the constitution of FIG. 1 does not go beyond about $10^{-7}$ Pa where $I_f$ is negligible.

Therefore, in the case of an application such that there is need for measuring pressure in the ultra high vacuum, it is preferable to take a constitution shown in the second embodiment that will be described separately.

As described above, in the ionization vacuum device according to the first embodiment of the present invention, it is equipped with the anode 11 and the cathodes (12a, 12b) in the vacuum vessel 13, and furthermore equipped with the power source 18 for heating to heat the cathodes (12a, 12b), and the controller that controls heating by the power source 18 for heating so as to maintain the surface temperature of the cathodes (12a, 12b) within a temperature range of 200° C. or more and where the cathodes (12a, 12b) do not cause thermonic electron emission.

With this system constitution, while a voltage for discharge is applied between the anode 11 and the cathodes (12a, 12b) to generate gas discharge and pressure measurement or pumping is performed, by increasing the temperature of the cathodes (12a, 12b), particularly by increasing the temperature to within a temperature range of 200° C. or more, contaminating materials and contaminating material ions, which reached the cathodes (12a, 12b), can be quickly separated from the surface of the cathodes (12a, 12b). This makes it possible to prevent polymer insulating film from being formed on the surface of the cathodes (12a, 12b). Thus, sensitivity reduction and discharge stop caused by cathode contamination can be prevented to enable stable and highly accurate pressure measurement.

Further, the upper limit of heating temperature of the cathodes (12a, 12b) in FIG. 1 is suppressed to temperature at which thermonic electrons are not generated from the cathodes (12a, 12b) or less, and thus it is lower (1000° C. or less) than heating temperature (1200° C. or more) of a hot cathode filament of a Bayard-Alpert (BA) type ionization gauge. Additionally, since the cathodes (12a, 12b) are in a plate-shape, there is no fear of burnout wire at all when temperature is elevated.

Furthermore, since the upper limit of heating temperature of the cathodes (12a, 12b) is suppressed to a temperature range in which thrmonic electrons are not generated from the cathodes (12a, 12b), thrmonic electrons are not emitted from the cathodes (12a, 12b). Therefore, it becomes possible to measure a gas discharge current without disturbing a discharge phenomenon that is caused by two electrodes of the anode 11 and the cathodes (12a, 12b). It can lead to performing stable and highly reliable pressure measurement without suffering from contamination for a long period of time.

Further, by using conductive oxide such as an oxide sintered body or conductive ceramics as a constituent material of the cathodes (12a, 12b), oxidation of the cathode made of the oxide does not develop even when operating in oxidizing gas such as oxygen and ozone. Specifically, even in pressure measurement atmosphere where pressure measurement could not be performed because of sensitivity reduction and discharge stop due to the formation of oxide in the case of using a conventional cold cathode ionization vacuum gauge equipped with metal cathode, stable and highly accurate pressure measurement is enabled by the use of conductive ceramics such as an oxide sintered body which is capable of preventing sensitivity reduction and discharge stop due to the formation of oxide.

Further, in the case where graphite is used as a constituent material of the cathodes (12a, 12b), reaction with contaminating gas of halogen gas or halogen compound is hard to occur, and thus stable and highly reliable pressure measurement is enabled over a long period of time.

Note that the ionization vacuum device according to the first embodiment of the present invention is allowed to communicate with a chamber (vacuum vessel) of another vacuum device, and used to decompress inside the chamber or measure a pressure inside the chamber. An electron microscope, a surface analyzer, an ion implantation apparatus, a sputtering apparatus, an etching apparatus, a (CVD) chemical Vapor Deposition apparatus, an accelerator or the like falls under such another vacuum device, for example. The same applies to the ionization vacuum device according to embodiments explained below.

Second Embodiment

Figure 4:
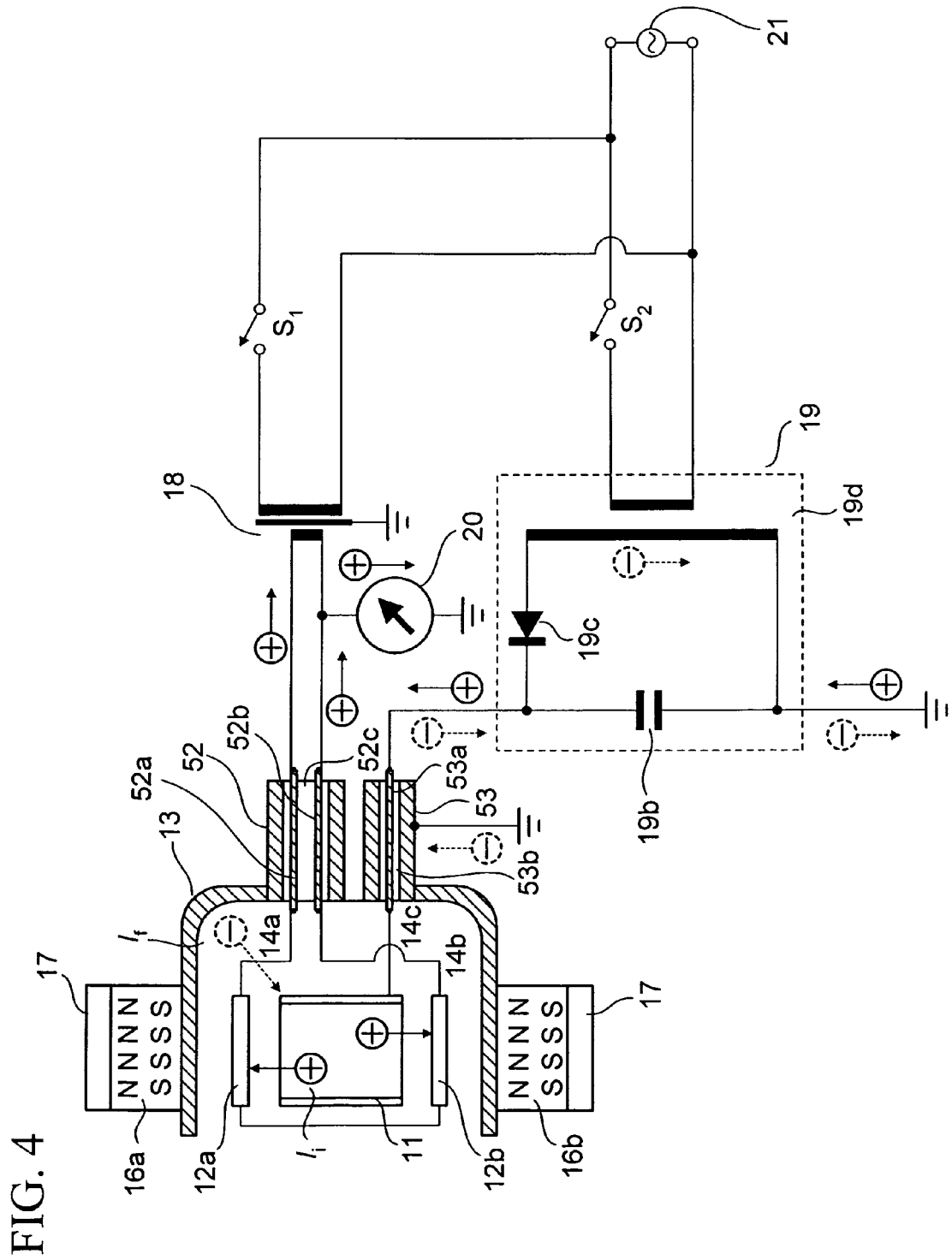
FIG. 4 is a schematic view showing a constitution of an ionization vacuum device being the second embodiment of the present invention.
Figure 6B:
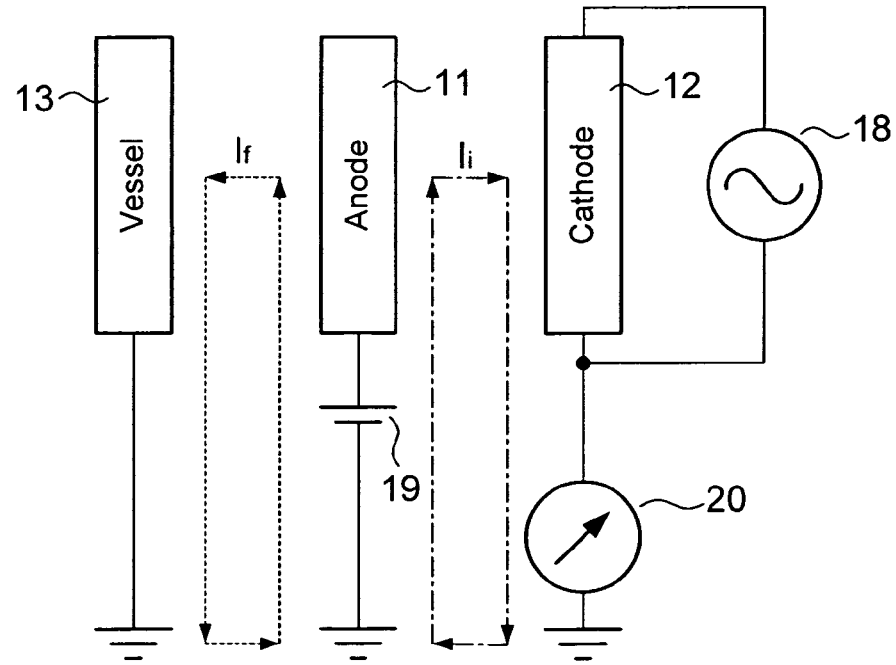
FIG. 6B is an equivalent circuit diagram of FIG. 4.

FIG. 4 is the schematic view showing the constitution of the ionization vacuum device according to the second embodiment. FIG. 6B is an equivalent circuit of FIG. 4. The constitution of FIG. 4 and FIG. 6B is a constitution effective in removing the field emission current $I_f$ from a discharge current flowing between the anode 11 and the cathodes (12a, 12b) in the case of including pressure measurement in a ultra high vacuum range.

The following points of the constitution of FIG. 4 are different in contrast with the constitution of FIG. 1 that the cathodes (12a, 12b) are severally connected to the power source 18 for heating (heating means) via the vacuum vessel 13 and the high voltage triaxial vacuum feedthrough 51 (via the terminal whose one end is grounded). Those points in FIG. 4 are a point that the cathodes (12a, 12b) are directly connected (without grounding) to the power source 18 for heating without interposing the vacuum vessel 13 and the high voltage triaxial vacuum feedthrough 51 between them, an another point that one wiring 14a out of a pair of wirings (14a, 14b) connecting to the cathodes (12a, 12b) is connected to the plus side of the direct current electrometer 20 for measuring a gas discharge current and the minus side of the direct current electrometer 20 is grounded, and a more another point that the negative side of the high-voltage DC power source 19 is directly grounded.

Figure 3:
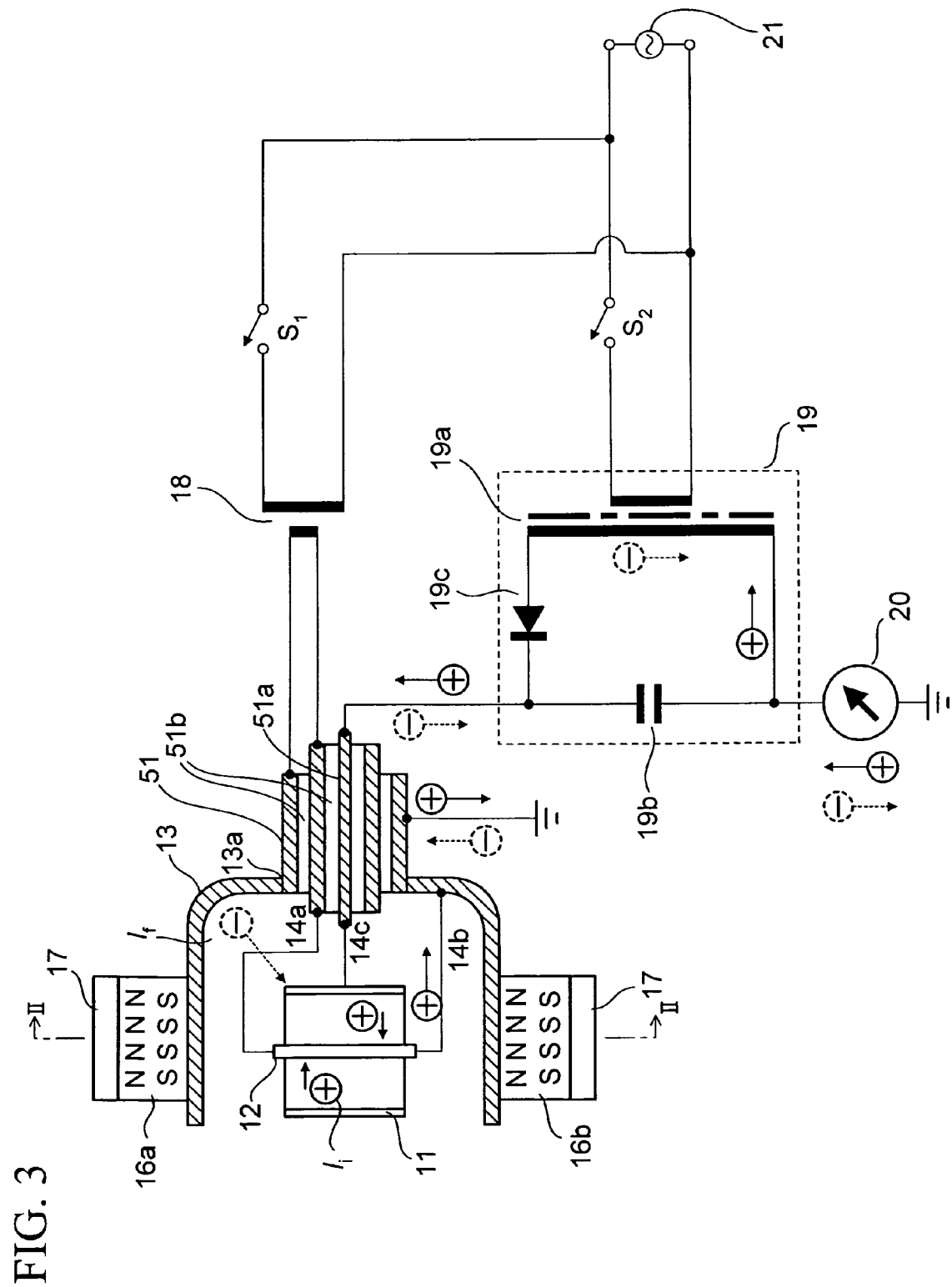
FIG. 3 is a schematic view showing a magnetron type configuration of a modified example of an ionization vacuum device being the first embodiment of the present invention.

Regarding another constitutions, reference numeral 19d is a step-up transformer and is not electrostatic-shielded unlike FIG. 1 and FIG. 3. This is because, even if a leakage current from an AC power source occurs, a connecting position of the electrometer 20 is changed and thus the leakage current does not flow into the electrometer 20. Reference numeral 52 denotes a shielded two-conductor terminal, and is constituted of an envelope cylinder and two terminals (52a, 52b) arranged in the cylinder. They are insulated to each other by a ceramics 52c. The terminal 52a is connected to the wiring 14a, and the terminal 52b is connected to the wiring 14b. Reference numeral 53 denotes a high-voltage vacuum terminal, and is constituted of the envelope cylinder and one terminal 53a arranged at a cylinder center. They are insulated to each other by a ceramics 53b. The terminal 53a is connected to a wiring 14c. The envelope cylinders of the shielded two-conductor terminal 52 and the high-voltage vacuum terminal 53 are set to grounded potential. Other constitutions are the same as FIG. 1 and FIG. 2, and constituent elements in FIG. 4 same as the constituent elements of FIG. 1 and FIG. 2 are indicated by the same reference numerals as those in FIG. 1 and FIG. 2.

In the ionization vacuum device of this constitution, description will be made below for reasons why the field emission current $I_f$ can be removed from a discharge current flowing between the anode 11 and the cathodes (12a, 12b) by referring to FIG. 4 and FIG. 6B. In FIG. 6B, reference numeral 12 denotes an entire cathode constituted by connecting the cathodes (12a, 12b) in series to each other.

When field-emitted electrons burst from the wall of the vacuum vessel 13 directly flow into the anode 11, a current caused by this (which is called the field emission current $I_f$, and is shown in FIG. 4 by the electron flow in dashed lines (flowing in arrow directions attached with −symbols)) flows in the route of the anode 11—the high-voltage vacuum terminal 53 (the terminal 53a)—the high-voltage DC power source 19—grounding—the vacuum vessel 13—the anode 11. In this case, the cathodes (12a, 12b) are not connected to the vacuum vessel 13 and other vacuum parts in the vacuum vessel 13, which is used while being grounded. And furthermore, the cathodes (12a, 12b) are grounded via the terminal 52b of the shielded two-conductor terminal 52 and the electrometer 20 connected to the transformer 18. Thus, the field emission current If does not flow in the route.

On the other hand, positive ions created by ionizing gas by a direct current high voltage, which is applied between the anode 11 and the cathodes (12a, 12b (12)) via grounding, are subject to charge exchange on the cathodes (12a, 12b (12)). The current $I_i$ (flowing in arrow directions in the circuit attached with +symbols) based on the ions created on the cathodes (12a, 12b (12)) flows in the route of the cathodes (12a, 12b (12))—the shielded two-conductor terminal 52 (terminal 52b)—the electrometer 20—grounding—the high-voltage DC power source 19—high-voltage the terminal 53a—the anode 11—the cathodes (12a, 12b (12)).

As described above, in the ionization vacuum device according to the second embodiment, by directly connecting the power source 18 for heating and the electrometer 20 to the cathodes (12a, 12b) without connecting the vacuum vessel 13 to the cathodes (12a, 12b), the field emission current $I_f$ can be removed from a discharge current flowing between the anode 11 and the cathodes (12a, 12b). Furthermore, since the electrometer 20 is disconnected from the high-voltage vacuum terminal 53, even if the insulating properties of a high-voltage cable (not shown) of the high-voltage vacuum terminal 53 are reduced with continuous use to cause a leakage current to occur, it does not flow into the electrometer 20. Therefore, highly accurate ion current measurement is always enabled.

Thus, when a pressure in the vacuum vessel 13 reached an ultra high vacuum range, temperature of the cathodes (12a, 12b) is independently elevated and the cathodes are activated to allow it to work as a sputter-ion pump and to fulfill a function as a cold cathode vacuum gauge by enabling highly accurate pressure measurement.

Further, the embodiment of FIG. 1 requires an expensive high-voltage power source 19 and high electrostatic shielding of high reliability. However, the embodiment of FIG. 4 has a merit that a high-voltage power source applied with special electrostatic shielding is not required. Because, even if a leakage current from the AC power source 21 occurs, the leakage current does not flow into the electrometer 20. Specifically, the the high-voltage DC power source 19 can cost just a low level.

Furthermore, the ionization vacuum device of the second embodiment is equipped with the power source 18 for heating to heat the cathodes (12a, 12b) and the controller that controls heating by the power source 18 for heating so as to maintain the surface temperature of the cathodes (12a, 12b) within a temperature range of 200° C. or more and where emission of thermonic electrons does not occur from the cathodes (12a, 12b) in the same manner as the first embodiment. For this reason, during discharge of gas in the vacuum vessel 13 and measurement of pressure or pumping, the cathodes (12a, 12b) can be heated while maintaining the surface temperature within a temperature range of 200° C. or more and where thermonic electrons are not emitted. This heating makes it possible to prevent polymer insulating film from being formed on the surface of the cathodes (12a, 12b). As a result, sensitivity reduction and discharge stop caused by cathode contamination can be prevented, whereby stable and highly accurate pressure measurement is enabled.

Further, since the upper limit of heating temperature of the cathodes (12a, 12b) is at a level at which thermonic electrons are not emitted, and since the cathodes (12a, 12b) are in a plate shape, there is no fear of breaking wire at all when temperature is elevated.

Furthermore, since thermonic electrons are not emitted from the cathodes (12a, 12b), it becomes possible to measure a discharge current without disturbing discharge that is created by two electrodes of the anode 11 and the cathodes (12a, 12b). Thus, stable and highly reliable pressure measurement can be performed for a long period of time without suffering from contamination.

(Performance Survey of the Ionization Vacuum Device According to the First and Second Embodiments)

Figure 11:
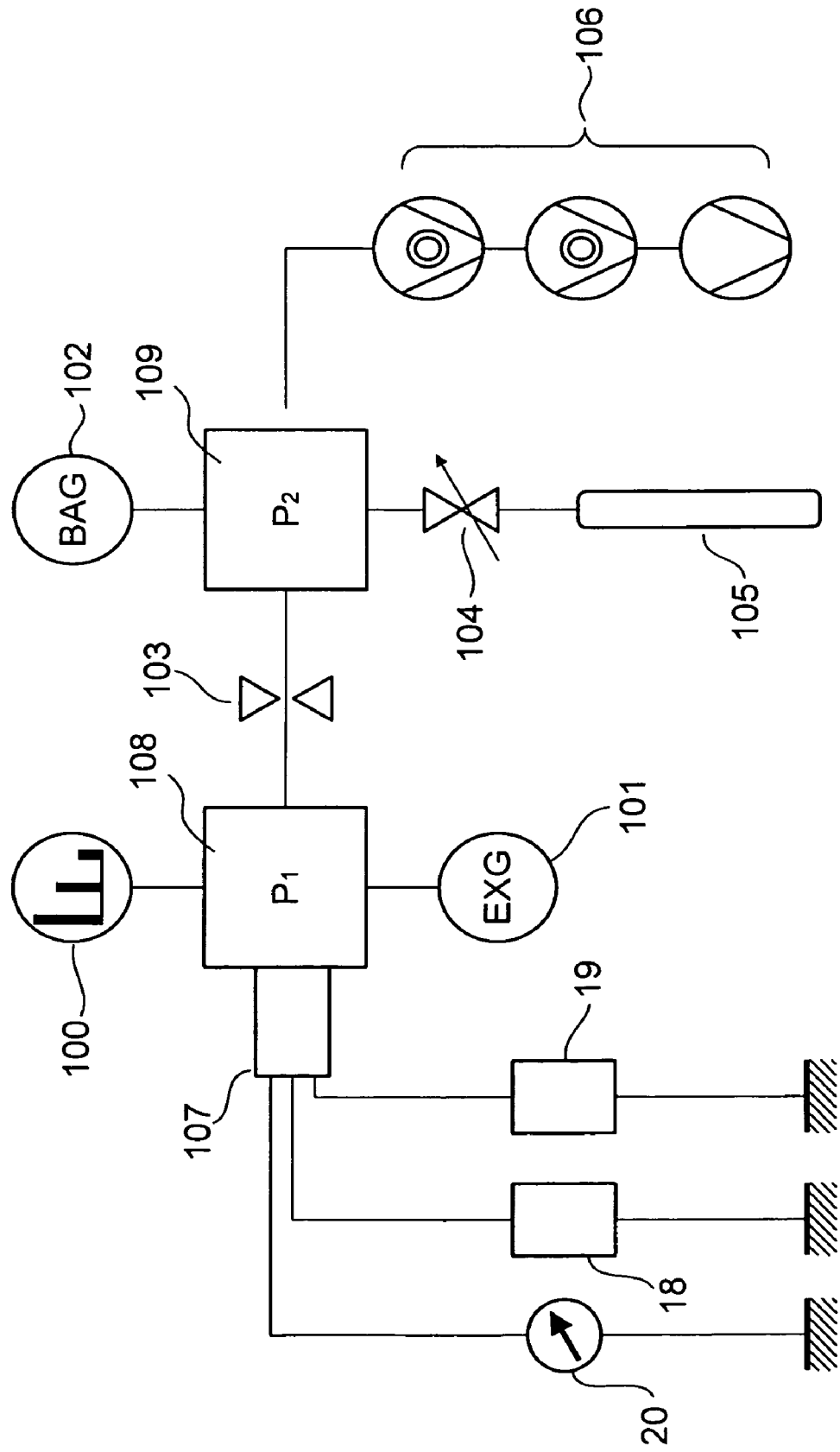
FIG. 11 is a constitution view of a vacuum pumping device used in performance survey of the ionization vacuum device of the present invention.

By using a vacuum pumping device for experiment use as shown in FIG. 11, performance survey was conducted for the ionization vacuum device according to the embodiments of FIG. 1 and FIG. 4.

In FIG. 11, reference numeral 107 denotes an ionization vacuum device for undergoing a test connected to a chamber 108 to be measured, and it is equipped with the power source 18 for heating, the high-voltage DC power source 19 and the electrometer 20 which are shown in FIG. 1 or FIG. 4. Further, a measurement instrument (quadrupole mass spectrometer) 100 that checks gas component in the vacuum device 107, and an extractor type ionization vacuum gauge (hot cathode type ionization gauge capable of measuring a pressure of $1 \times 10^{-10}$ Pa or higher) 101 capable of measuring a pressure of $1 \times 10^{-10}$ Pa or higher inside the vacuum device 107 are connected to the chamber 108. Furthermore, another chamber 109 provided for measuring pumping speed is connected to the chamber 108 via an orifice 103 capable of controlling gas flow rate. An exhaust system pump 106 and a BA type ionization vacuum gauge 102 that measures a pressure inside the chamber 109 are connected to the chamber 109, and furthermore, a test gas tank 105 is connected thereto via a gas adjusting valve 104.

The ultimate pressure of this system is $2 \times 10^{-9}$ Pa, and under the ultimate pressure, 90% or more of residual gas component is hydrogen.

The ionization vacuum device of the embodiment of FIG. 1 was used as the vacuum device 107, and for the survey, the anode 11 having the diameter of 15 mm and the height of 12 mm, and the cathodes (12a, 12b) made up of a tantalum plate having the thickness of 0.1 mm and the width of 10 mm were used.

First, intensity of magnetic field was set to 0.2 T(tesla). After baking the chamber 108 and the vacuum device 107, a vacuum pressure inside the vacuum device 107 reached $2 \times 10^{-9}$ Pa. From this state, the high-voltage power source 19 of the vacuum device 107 was set to 5 kV, but a gas discharge current did not flow.

When nitrogen gas was introduced from the test gas tank 105 into the chamber 108 to increase pressure, the discharge current flowed for the first time when the pressure reached $5 \times 10^{-7}$ Pa that is higher by about 2 digits. Under this pressure or higher, the gas discharge current was substantially proportional to the pressure, and the proportional relationship continued to $10^{-1}$ Pa. Thus, it was confirmed that the vacuum device 107 for undergoing the survey of the same type as shown in FIG. 1 worked as a vacuum gauge in a pressure range from $5 \times 10^{-7}$ Pa to $10^{-1}$ Pa.

Next, the vacuum device 107 was baked again and a switch $S_2$ was closed at the time when the vacuum pressure reached $5 \times 10^{-7}$ Pa. Then, discharge did not occur as well.

Accordingly, a switch $S_1$ was closed and power for heating was supplied to the cathode. Then, temperature reached about 800° C. in about 3 seconds, and discharge began. At this time, the pressure of the extractor type vacuum gauge once rose to $10^{-7}$ Pa, but when the switch $S_1$ was turned off in 3 seconds, the pressure of the extractor type vacuum gauge dropped to the original $3 \times 10^{-9}$ Pa, and discharge was sustained in this state. However, discharge in this state was instable because the field emission current was mixed, and a measured current fluctuated randomly between 2 and $5 \times 10^{-10}$ A.

When pure nitrogen gas was introduced from this state, discharge was stabilized from around $5 \times 10^{-8}$ Pa, and it was confirmed that the vacuum device 107 operated as a cold cathode vacuum gauge.

As described above, it was confirmed by the experiment that discharge could be securely re-started by giving a pulse state power for heating to the cathodes to increase the temperature even if discharge is in a stop state in an ultra high vacuum range. Specifically, it was possible to demonstrate that the cold cathode vacuum gauge in failure could be re-started by heating of the cathode due to application of pulsed current.

Next, performance survey of the ionization vacuum device (the vacuum device 107) shown in FIG. 4 was executed. The high-voltage vacuum terminal 53 and a triaxial current terminal 52 for heating cathode are separated independently. The high-voltage power source 19 used is a versatile type to which electrostatic shielding is not provided.

First, the inside of the vacuum device 107 was exhausted through the chamber 108. Then, at the state where a degree of vacuum reached $2 \times 10^{-9}$ Pa, an output voltage of the high-voltage DC power source 19 was set to 5 kV, and the $S_1$ was closed to heat and activate the cathodes. Thus, discharge easily started in the vacuum device 107, the electrometer 20 indicated the current value of $3 \times 10^{-10}$ A, and very stable measurement could be performed. With subsequent introduction of nitrogen gas, indication of the electrometer 20 rose in substantially proportion to the pressure, and it was possible to confirm that the device operated as a stable vacuum gauge in a range reaching 0.1 Pa.

As described above, according to the ionization vacuum device shown in FIG. 4, it was possible to securely activate discharge in the ultra high vacuum range of $10^{-9}$ Pa, and it could be confirmed that it was possible to provide an ionization gauge and a sputter-ion pump, in which an error by electric field emission was minimized to enable highly accurate pressure measurement in a wide range of pressure from $10^{-9}$ Pa mark to 0.1 Pa.

Third Embodiment

Figure 7:
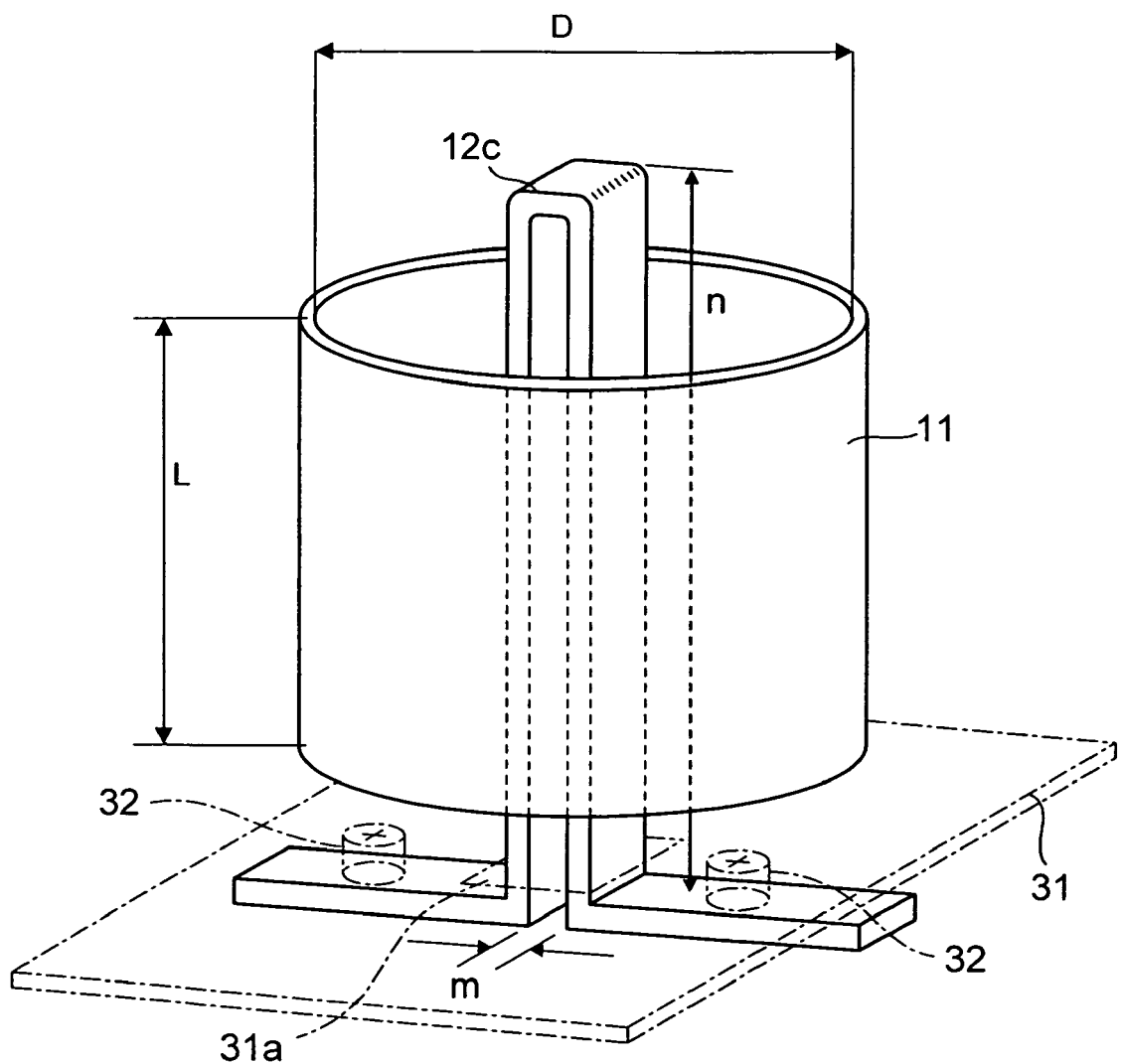
FIG. 7 is a perspective view showing a cell structure of an ionization vacuum device being the third embodiment of the present invention.

FIG. 7 is the perspective view showing the constitution of a cell 201 including the electrodes of a single cell type ionization vacuum device, which has a cathode of an inverted U-character shaped structure according to the third embodiment.

The single cell 201 having the electrode structure as shown in FIG. 7 is also called a magnetron cell. Note that the cell 201 is installed instead of the cell of FIG. 1 or FIG. 4, for example to constitute the ionization vacuum device. This ionization vacuum device can be used as at least one of a magnetron type sputter-ion pump and a cold cathode ionization vacuum gauge.

In the electrode shown in FIG. 7, points that are different from FIG. 4 are that a cathode 12c is in an inverted U-character shaped structure where a thin and long plate-shaped cathode material is bent into a U-character shape including two terminals and tip portions connecting with the two terminals, and that the electrode is equipped with a sputter-shield plate 31 at the lower part outside the cylinder of the anode 11.

The anode 11 has the same cylindrical shape as FIG. 4. To realize a sputter-ion pump having a most versatile middle pumping speed (0.05 m³/s to 0.1 m³/s) and compatible with the most versatile standard flange ICF152, it is desirable to make the shape of the anode 11 in a cylindrical shape, the outer diameter D be 20 mm or more and 50 mm or less, and the height be D/3 or more and D or less. This is also applicable to the anode 11 of the first and second embodiments.

The cathode 12c is installed such that the symmetric axis of the inverted U-character shaped structure of the cathode 12c is approximately matched with the central axis of the cylindrical anode 11, and a part between the two terminals and the tip portions are housed inside the cylinder of the anode 11. The cathode 12c is in a structure where the two terminal portions are laterally bent in opposite directions in a lower part outside the cylinder of the anode 11.

In the case of supplying a current to the cathode 12c from outside the vacuum vessel to activate the cathode, the current is supplied via vacuum terminals of φ2.3 mm (diameter)×two copper wires embedded in a general flange of ICF034 size. The maximum current that can be flowed in the copper wires is about 50 A, so that when the cathode is a titanium plate, its cross-sectional area needs to be 5 mm² or less in order to obtain the temperature of at least 500° C. at 50 A. On the other hand, the area is preferably be 0.5 mm² or more for the practical use of the pump. Consequently, it is desirable that the cross-sectional area of the conductive material of the cathode be 0.5 mm² or more and 5 mm² or less. If there is need for obtaining temperature lower than 500° C., a current should only be decreased.

When the ionization vacuum device having the electrode shown in FIG. 7 is operated as a pump and sputtering of the cathode material occurs violently inside the cylinder of the anode 11, then the sputter-shield plate 31 prevents incoming sputtered cathode material from attaching on the laterally bent insulated retaining portion of the both end portions of the cathode 12c. The sputter-shield plate 31 is provided at the lower part outside the cylinder of the anode 11 and above the laterally bent portions of the cathode 12c. Specifically, the cathode 12c is inserted in an opening portion (hole) 31a formed on the sputter-shield plate 31. Then, the cathode 12c is placed such that the a part between the two terminals and the tip portions of the cathode 12c are housed in the cylinder of the anode 11, and the two terminals are on the opposite side of the anode 11 to the sputter-shield plate 31.

The sputter-shield plate 31 is supported with a surface thereof on the opposite side to the anode 11 side by ceramics washers (supporting member) 32 attached on the laterally bent portions of the cathode 12c. It is desirable that the insulated ceramics washers 32 be provided on positions on the rear side of the sputter-shield plate 31, where the sputtered cathode material is hard to reach the most. Thus, even when sputtering of cathode material occurs, insulating properties of the insulated ceramics washers 32 can be secured. This is important in keeping the reliability of pumping performance in the case of utilizing as a sputter-ion pump and in keeping the reliability of a pressure measurement value in the case of utilizing as a cold cathode ionization vacuum gauge.

Note that the shape of the anode 11 is not limited to a cylindrical shape, but may be a hexagonal or square cylindrical shape. Further, the cathode 12c is not limited to one formed by processing a plate-shaped material, but may be one formed by bending a wire rod into a U-character shape.

Figure 8:
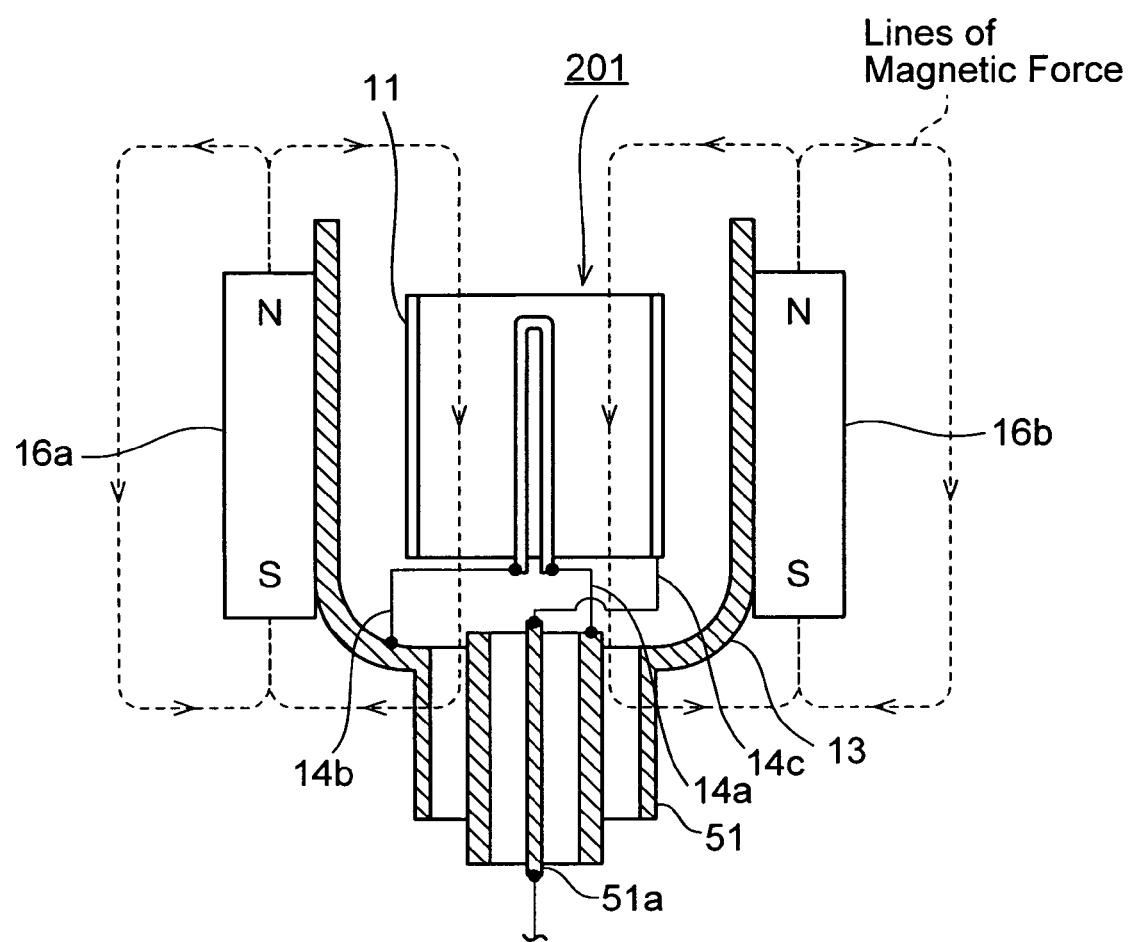
FIG. 8 is a cross-sectional view showing a constitution of a single cell type ionization vacuum device using the cell of FIG. 7.

Next, description will be made by referring to FIG. 8 for a single cell type ionization vacuum device in which the single cell type ionization vacuum device cell of FIG. 7 is housed in the vacuum vessel in a different cell arrangement from the cell arrangement of FIG. 1. Specifically, connection between the power source for cathode-heating, the high-voltage power source for discharge, the electrometer and the like is identical to FIG. 1 or FIG. 4. FIG. 8 is the schematic cross-sectional view of a single cell type ionization vacuum device.

In the single cell type ionization vacuum device of FIG. 8, unlike the ionization vacuum device of FIG. 1, the cylindrical anode 11 is installed inside the vacuum vessel 13 such that the central axis of the opening portion of the vacuum vessel 13 approximately matches the central axis of the cylindrical anode 11. In accordance with this, a cylindrical shaped permanent magnet 16a, 16b is installed outside the vacuum vessel 13 and on the side portion of the cylindrical anode 11, and the permanent magnet is arranged such that an orientation from the N-pole (upper edge of cylindrical magnet) to the S-pole (lower edge of cylindrical magnet) becomes parallel with the axis of the cylindrical anode 11. Thus, magnetic field lines are applied in an orientation parallel with the central axis of the cylindrical anode 11 inside the cylindrical anode 11. In FIG. 8, lines of magnetic force are shown in dotted lines. Connection to the ionization vacuum device and other constitutions about the power source 18 for heating and the power source 19 for discharge are the same as the ionization vacuum device of FIG. 1 or FIG. 4.

Note that the single cell of FIG. 7 can be also applied to the single cell type ionization vacuum device of FIG. 4 in the same arrangement as the arrangement of FIG. 8. Constitutions similar to FIG. 1 or FIG. 4, to which the cell arrangement of FIG. 8 apparently described here is applied, are also included in the range of the original invention.

Figure 9:
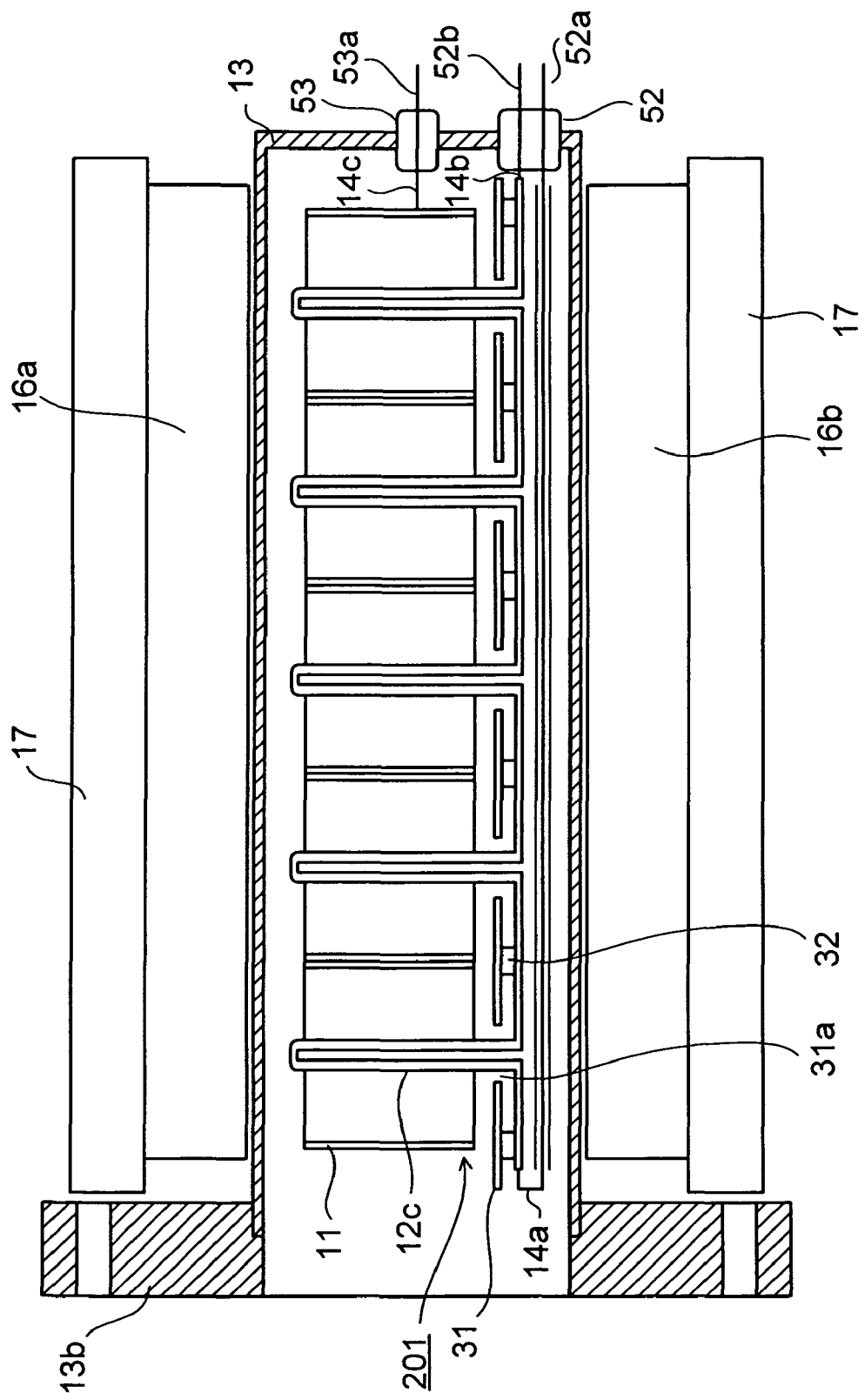
FIG. 9 is a cross-sectional view showing a constitution of a multiple cell type ionization vacuum device using the cell of FIG. 7.

Next, description will be made by referring to FIG. 9 for a multiple cell type ionization vacuum device in which a plurality of the single cells of FIG. 7 are arrayed. FIG. 9 is the schematic cross-sectional view of the multiple cell type ionization vacuum device in which a plurality of the single cells of FIG. 7 are arrayed.

The multiple cell type ionization vacuum device of FIG. 9 has a structure where five cells 201 are arrayed horizontally in a row. In the vacuum device, adjacent anodes 11 are allowed to contact to each other and welded into series connection. On the other hand, cathodes are formed by bending a long plate-shaped conductive material in inverted U-character shapes at five positions, and have a constitution in which the five inverted U-character shaped structures 12c are connected in series. The cathodes are installed such that symmetric axises of the five inverted U-character shaped structures 12c approximately match the central axises of cylinders of the five anodes arrayed in a row, respectively, and a part between the two terminals and the tip portion of each of the five inverted U-character shaped structures 12c is housed inside the cylinder of each of the anodes 11. Furthermore, the sputter-shield plate 31 is provided so as to cover the lower opening ends of respective anodes 11. On the sputter-shield plate 31, the opening portions 31a are formed on the five inverted U-character shaped structures 12c in such a manner that parts above the terminals can be inserted in the five anodes 11 via the sputter-shield plate 31, respectively.

The both ends of cathode, in which the five inverted U-character shaped structures 12c are connected in series, are connected to leading wires (14a, 14b), and are led outside the vacuum vessel 13 via terminals (52a, 52b) while maintaining insulation with the vacuum vessel 13. Connecting portions between the both ends of cathode and the leading wires (14a, 14b) are arranged on the rear side of the sputter-shield plate 31. Further, the unified anode 11 is led outside the vacuum vessel 13 via the terminal 53a by another leading wire 14c while maintaining insulation with the vacuum vessel 13.

The power source for cathode-heating and the high-voltage power source use the same power source circuit as that of FIG. 4, and connecting methods of the power source circuits to the ionization vacuum device should be the same as FIG. 4.

Note that in the case where the ionization vacuum device of FIG. 9 is used particularly as a multiple cell type magnetron type sputter-ion pump, the number of cells is not limited to five but can be a number larger than five in order to further enhance pumping performance, and further, this batch of the cells can be arrayed in plural numbers. In short, if each inverted U-character shaped structure 12c of cathode is installed inside each anode 11 and the inverted U-character shaped structures 12c are installed in a state that it is possible to heat at once by turning on electricity, the arrangement and the shape of each cell 201 are not particularly limited.

As described above, according to the ionization vacuum devices of FIG. 7 and FIG. 9, even if a current is flowed in the cathode to increase the temperature of the cathode, expanshion of the inverted U-character shaped structure 12c of cathode caused by increased temperature is developed in a symmetric axis direction n of the inverted U-character shaped structure 12c as shown in FIG. 7, and thus there is no possibility of contacting the anode 11 due to the expansion particularly in the case of the multiple cell type.

Further, the insulated ceramics washers 32 are arranged on the back side of the sputter-shield plate 31 and at positions most remote from a region where sputtering of cathode occurs inside the anode 11. Two effects can be obtained from this constitution.

Firstly, regarding the expansion of cathode on the rear side of the sputter-shield plate 31, at the time of increasing the temperature of cathode, the cathode on the rear side of the sputter-shield plate 31 is thermally insulated from the sputter-shield plate 31 by the insulated ceramics washers 32, so that the elevated temperature of the portion becomes lower than the elevated temperature of a cathode portion above the sputter-shield plate 31. Therefore, expanshion of the cathode on the rear side of the sputter-shield plate 31 is small. Further, even with the same material, if the bent plate made of the cathode material on the rear portion of the sputter-shield plate is made wider, resistance in the wide portion becomes smaller, heat generation is suppressed, and expanshion is also suppressed accordingly. For this reason, it becomes possible to narrowly design the width "m" of the U-character shape shown in FIG. 7 of the inverted U-character shaped structure 12c while contact of the two terminals is avoided. Secondly, when the ionization vacuum device is operated as a vacuum pump, even if the sputtering of cathode material occurs violently, sputtered cathode material is hard to reach the insulated ceramics washers 32, and thus the sputter-shield plate 31 can be supported while maintaining the insulating properties with the cathode. Thus, in the case of using the ionization vacuum device as the sputter-ion pump or in the case of using as the cold cathode ionization vacuum gauge, the reliability of pumping performance or pressure measurement value can be maintained.

Further, in the ionization vacuum device according to the third embodiment as well, constitution other than the cell 201 has the same constitution as FIG. 4, and thus it has the same effect as the second embodiment as shown below. Specifically, since the ionization vacuum device according to this embodiment is equipped with the power source 18 for heating to heat the cathode 12c, a controller that controls heating by the power source 18 for heating so as to maintain the surface temperature of the cathode 12c within a temperature range of 200° C. or more and where thermonic electrons are not emitted, then it becomes possible to prevent polymer insulating film from being formed on the surface of the cathode 12c by heating the cathode 12c during measuring pressure or pumping while maintaining the surface temperature within a temperature range of 200° C. or more and where thermonic electrons are not emitted. Thus, sensitivity reduction and discharge stop caused by cathode contamination are prevented. Accordingly, stable and highly accurate pressure measurement is enabled.

Furthermore, since thermonic electrons are not emitted from the cathode 12c, it becomes possible to measure a discharge current without disturbing a discharge phenomenon generated by two electrodes of the anode 11 and the cathode 12c. Thus, without suffering from contamination, stable and highly reliable pressure measurement can be performed for a long period of time.

Further, a special effect can be expected when it is used as a sputter-ion pump. Specifically, before operating the magnetron type sputter-ion pump of the present invention, a pumping system 106 of FIG. 11 is attached as an auxiliary pump to a chamber 108 via a cut valve (not shown), and pressure is reduced to approximately $10^{-3}$ Pa. After that, the switch $S_2$ of FIG. 4 is turned ON to operate the sputter-ion pump. At the time of performing the preliminary pumping, a current is flowed to the inverted U-character shaped cathode to activate the cathode. By turning only the switch $S_1$ ON without turning the switch $S_2$ ON, gas stored in the previous process can be expelled from the cathode. Since the pump is not working as a sputter-ion pump at this time, a problem does not occur even if the temperature is increased to high temperature, at which thermonic electron emission from the U-character shape type cathode material occurs, or more. Furthermore, high radiation heat is irradiated inside the cell due to the increasing of temperature, the temperature of many pump constituent materials including the anode inside the vacuum vessel 13 is elevated. Specifically, together with the activation of the cathode, a baking operation can be effectively performed in a short time. After the baking, if after the temperature dropped to a certain level, the valve of auxiliary pumping system is closed and afterwards the switch $S_2$ is turned ON, then ultra high vacuum can be easily achieved.

Further, the following effect can be also expected. In the state where a pressure reached the ultra high vacuum range, a main component of residual gas is hydrogen, and its pumping speed as a sputter-ion pump almost becomes zero. However, in the magnetron type sputter-ion pump of the present invention, it is possible to elevate the temperature of only the inverted U-character shape cathode portion to especially high temperature. For this reason, in the case where titanium metal is used for the inverted U-character shape cathode, for example, titanium atoms can be evaporated inside the cylinder anode at the vapor pressure of about $10^{-3}$ Pa when the cathode is heated to about 1300° C., and thus the pump can be functioned also as a titanium sublimation pump. If the inverted U-character shaped portion is formed of a stranded wire of tungsten wire and titanium wire being a refractory metal, it is possible to obtain this vapor pressure or higher. Even when the pump is functioned as such a titanium sublimation pump, the ceramics support sections of the terminals of the inverted U-character shaped cathode are on the rear side of the sputter-shield plate. This is because of none other than the reason that the present invention uses the constitution where the temperature of the ceramics sections is made lower.

(Performance Survey of the Ionization Vacuum Device According to the Third Embodiment)

Next, description will be made for the performance survey of the ionization vacuum device of FIG. 9 and its survey result.

Figure 10A:
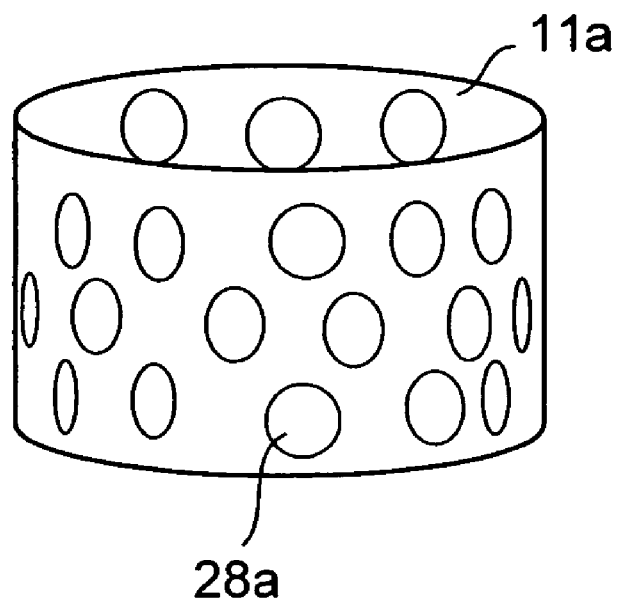
FIG. 10A and FIG. 10B are perspective views showing modified examples of an anode of an ionization vacuum device being the fourth embodiment of the present invention.

In the ionization vacuum device used for performance survey, an anode 11*a* having the shape as in FIG. 10A was used instead of the anode 11 of FIG. 7. The anode 11*a* was formed by rolling a punched metal plate of stainless steel having the thickness of 0.3 mm into a cylinder having the diameter of 30 mm and the height of 17 mm as shown in FIG. 10A. Then, eight anodes 11*a* were connected in series on a cylinder side surface by spot welding, groups of the eight anodes 11*a* were arrayed in three rows into an anode group of twenty four in total. Although the anode 11*a* having the shape such as in FIG. 10A is used in this survey, it may be an anode 11*b* having the shape of FIG. 10B.

On the other hand, regarding the cathode, thin and long plate of pure titanium having the thickness of 0.4 mm, the width of 6.6 mm and the length of about 600 mm was bent in a U-character shape at the U-character width "m" of about 5 mm while an inteval and arrangement were matched with the arrangement of the anode group. And a series of twenty four inverted U-character shaped structures 12*c* was prepared. In this cathode, it was confirmed that the temperature of the partial inverted U-character shaped structure 12*c* could be elevated to about 1200° C. in about 1 minute when a voltage of 40V and a current of 37A were applied in vacuum.

As the sputter-shield plate 31, a plate made of pure titanium having the thickness of 0.4 mm, the width of 100 mm and the length of 300 mm was used. On the plate, twenty four square holes of 10 mm×10 mm were made at positions where the inverted U-character shaped structures 12*c* of cathode were to be set up in each anode 11*a* of the anode group.

Then, the sputter-shield plate 31 was arranged under the anode group, the inverted U-character shaped structures 12*c* of cathode were severally inserted from the holes of the sputter-shield plate 31 to form a multiple cell.

Further, a vacuum vessel same as FIG. 9 was used as the vacuum vessel 13 for installing the above-described multiple cell, and a plate-shaped neodymium rare earth magnet having the thickness of 20 mm, the width of 100 mm and the length of 240 mm was used as magnets (16*a*, 16*b*).

The strongest magnetic field at the center portion is as strong as 0.4 T (tesla). Further, the yoke 17 was provided on the outer periphery of the magnets (16*a*, 16*b*) to form a closed magnetic circuit by way of the magnets (16*a*, 16*b*).

A power source circuit same as the one shown in FIG. 4 was used and wiring connection same as FIG. 4 was performed to constitute an ionization vacuum device.

Other constitutions are the same as FIG. 4, and constituent elements in FIG. 9 same as the constituent elements of FIG. 4 are shown in the same reference numerals as FIG. 4.

Performance survey was carried out by attaching the above-described ionization vacuum device as the vacuum device 107 to the vacuum pumping device for experiment of FIG. 11. Pumping speed to nitrogen and argon and measurable vacuum pressure were surveyed in the performance survey.

In the performance survey, first, pumping test was carried out for plural times to stabilize the device, and then baking was carried out to the chamber 108 and the multiple cells of the vacuum device 107. This results in lowering of the ultimate vacuum pressure inside the chamber 108 comparing to the state before baking, and $1\times10^{-9}$ Pa was obtained. The reason why the ultimate vacuum pressure is lowered is considered that titanium was sputtered when the pumping test was carried out, and pumping speed of the ion pump to hydrogen was accelerated than before.

Pure nitrogen gas was gradually introduced first into the chamber 109 that is connected to the chamber 108 in the ultimate vacuum pressure state, and the increasing of pressure $P_1$ of the chamber 108 associated with the increasing of pressure $P_2$ inside the chamber 109 was measured. Based on a relational expression of flow rate measurement that pumping speed $S=C(P_2/P_1-1)$, the pumping speeds S of the test pump were calculated and plotted on a graph. Then, a result shown in FIG. 12 was obtained. Herein, reference code C denotes a conductance of orifice, and its value is $1\times10^{-3}$ m³/s. As shown in the curve of $N_2$ in FIG. 12, the maximum pumping speed to nitrogen is near $1\times10^{-5}$ Pa, and its value is 0.2 (m³/s) which is very large. In contrast, the pumping speed of a sputter-ion pump having approximately the same number of cells in a conventional ion pump is 0.06 to 0.07 (m³/s). Accordingly, the test pump has the pumping speed about three times as high as the conventional ion pump.

Figure 12:
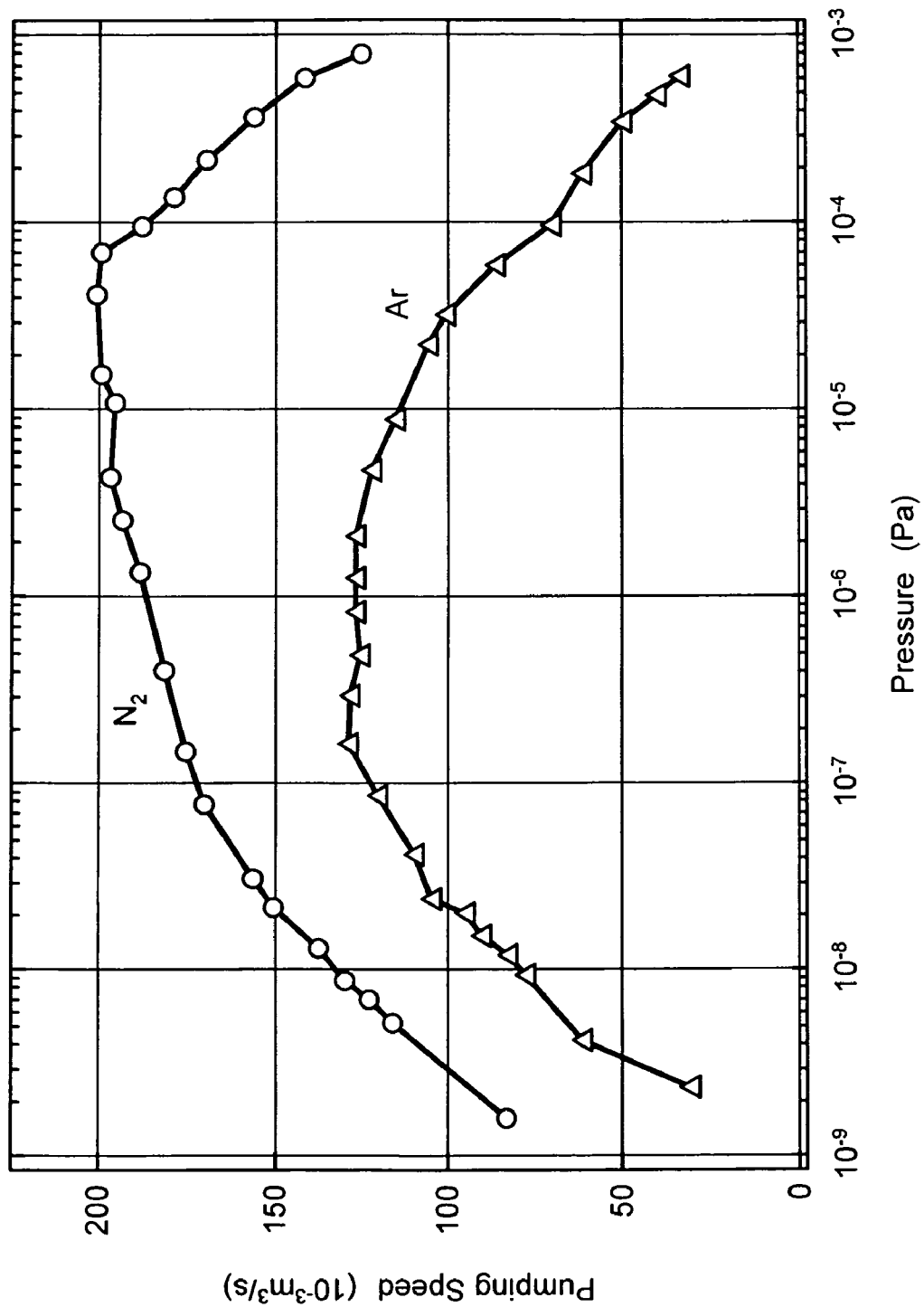
FIG. 12 is a graph showing the surveyed result of a relationship between pressure and pumping speed in the ionization vacuum device of FIG. 9.

Next, a measurement result of the pumping speed which was performed to argon is shown in an Ar curve in the same FIG. 12.

As shown in FIG. 12, it is found that the maximum pumping speed is obtained in the pressure range from $10^{-7}$ Pa to $10^{-5}$ Pa, and its pumping speed reaches 0.12 (m³/s) which is as high as 60% of nitrogen (0.2 (m³/s)) and higher than that of conventional StarCell pump (manufactured by Varian, Inc. of U.S.) by as much as 10%. To obtain about the same pumping performance by a conventional ion pump, it has to be a sputter-ion pump with the pumping speed of 400 to 600 m³/s or more to nitrogen. Accordingly, it is found that the effect of the present invention is remarkably large.

As described, the excellent performance of the ionization vacuum device of this embodiment means none other than the employment of a mechanism where the cathode is formed in the inverted U-character shaped structure 12c, the inverted U-character shaped structures 12c are connected in series, heating due to application of electric current is performed at once to them, and after that the vacuum device is operated as a pump.

Figure 13:
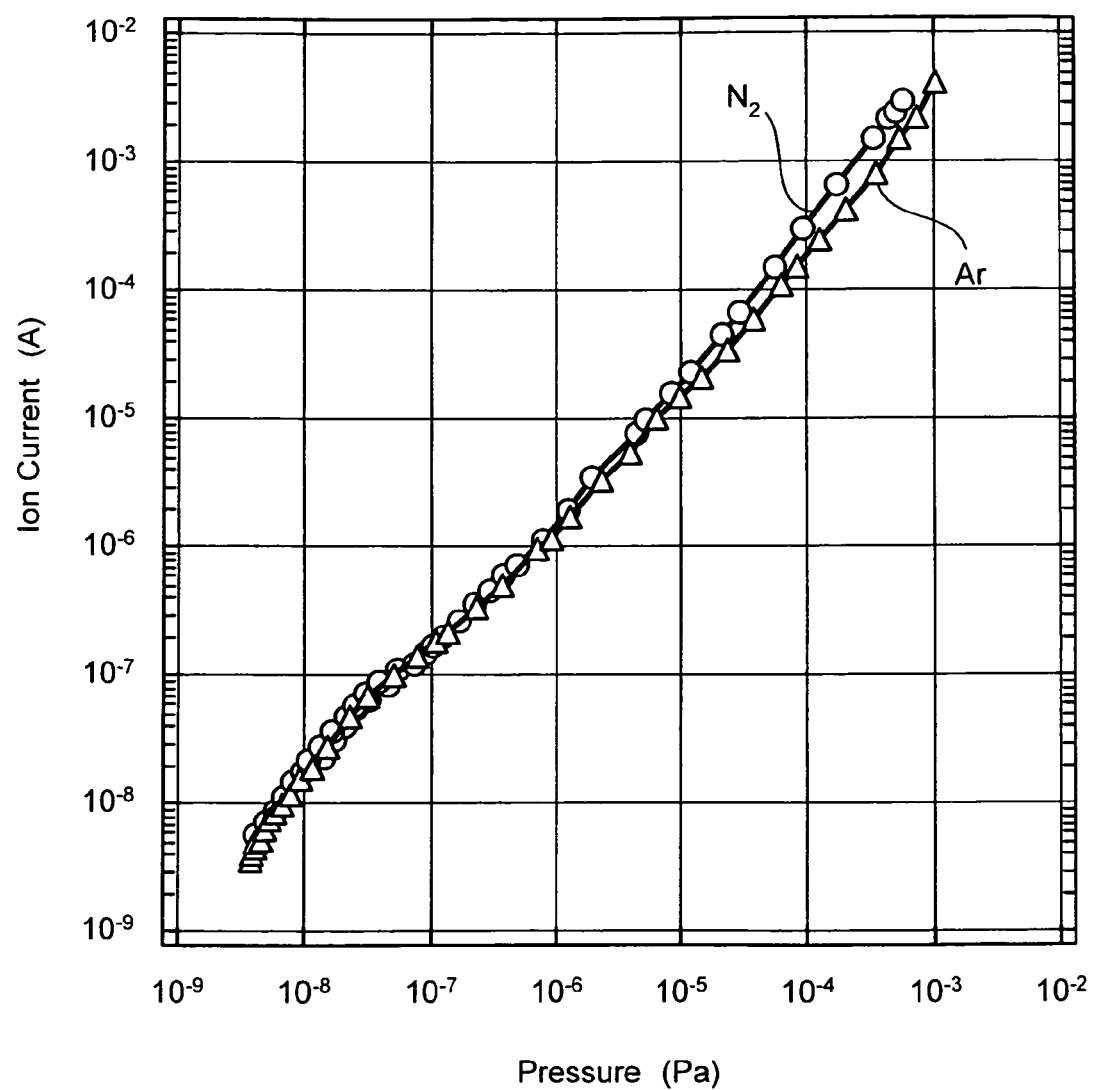
FIG. 13 is a graph showing the surveyed result of a relationship of ion current to a pressure in the ionization vacuum device of FIG. 9.

Next, the graph of FIG. 13 shows how the ion current $I_i$ changes to the rising of pressure P when gas is introduced into the vacuum pumping device for experiment use of FIG. 11.

As the graph describes apparently, it is found that indication of the electrometer (ion current value) of both argon and nitrogen is substantially proportional to the pressure in a wide pressure range from $10^{-9}$ Pa to $10^{-3}$ Pa, and also shows significantly high pressure measurement accuracy as the cold cathode ionization vacuum gauge.

Further, an ion current (indication of electrometer) in a discharge current under $1\times10^{-9}$ Pa predicted from the graph is approximately 1 nA ($1\times10^{-9}$ A). Since the current value obtained from a regular hot cathode type ionization gauge is 1 to $2\times10^{-13}$ A under the same pressure. The current value is ten-thousand times larger than this. For this reason, current measurement for measuring the vacuum pressure becomes very easy, and a measurement device can be manufactured inexpensively.

Further, the fact that linearity can be maintained to $10^{-9}$ Pa is the effect due to insulating the cathode of the inverted U-character shaped structure 12c from the vacuum vessel 13 and making only an ion current flowing into the cathode directly readable by the electrometer, and is the effect due to preventing field emission current from the vacuum vessel 13 wall from entering the electrometer.

Fourth Embodiment

Figure 10B:
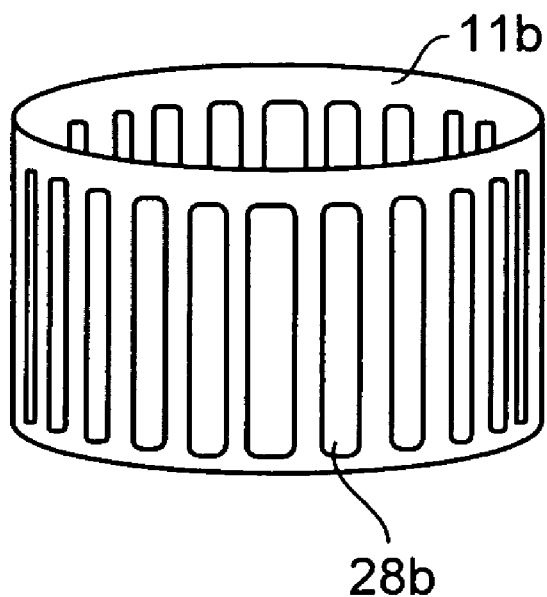

FIG. 10A and FIG. 10B are the perspective view showing an anode structure of ionization vacuum device according to the fourth embodiment.

The anode structure of the vacuum device according to the fourth embodiment is not a simple cylinder structure but a punched metal structure where circular-shaped opening portions 28a or square-shaped opening portions 28b are provided on the cylinder side surface, as shown in FIG. 10A and FIG. 10B. This allows gas to flow through the cylinder side surface, and pumping conductance can be increased. Therefore, even in the case where vacuum device is attached to the vacuum vessel via a flange with a narrow inlet, pumping conductance is not limited by the inlet area of the flange, so that the pumping speed can be improved. According to the above-described experiment, in the vacuum device of the third embodiment which employed the anode (11a, 11b) structures shown in FIG. 10A and FIG. 10B, an experiment result of pumping speed in which the pumping speed to nitrogen is three times as higher as a conventional one can be obtained.

Note that the anode structure is not limited to the ones shown in FIG. 10A and FIG. 10B. It may be a cylinder side surface constituted of wire mesh. The point is that a method is not limited as long as gas is allowed to flow through the cylinder side surface of anode.

Further, this anode structure is applicable not only to the vacuum device of the third embodiment but to the vacuum device of another embodiment.

The present invention has been described above in detail by the embodiments, but the scope of the invention is not limited to the examples specifically shown in the above-described embodiments, and modifications of the above-described embodiments without departing from the gist of the invention are included in the scope of the invention.

For example, both pre-heating and heating for starting (activating) discharge are performed in the above-described performance survey of the ionization vacuum device according to the first and second embodiments, but only the pre-heating is also acceptable, only the heating for starting discharge is also acceptable, or both may not be performed.

Further, the power source 18 for heating that supplies AC electric power is used in the above-described embodiments, but a DC power source of a DC-DC converter where input and output are insulated, a power source for heating that supplies DC electric power, which is a charging battery, for example, may be used instead.

Further, in the vacuum device constituted of a plurality of cells, the anode 11 and the cathodes (12a, 12b, 12c) are connected in series to each other in the above-described embodiments, but they may be connected in parallel to each other. In the case of parallel connection as well, all the cathodes (12a, 12b, 12c) can be simultaneously heated in the same manner as the series connection.

Further, a constitution where the cathode 12c of the inverted U-character shaped structure is set upside down is also included in the present invention. Therefore, the cathode 12c of the inverted U-character shaped structure is a concept including the cathode of the U-character shaped structure as well.

Figure 5:
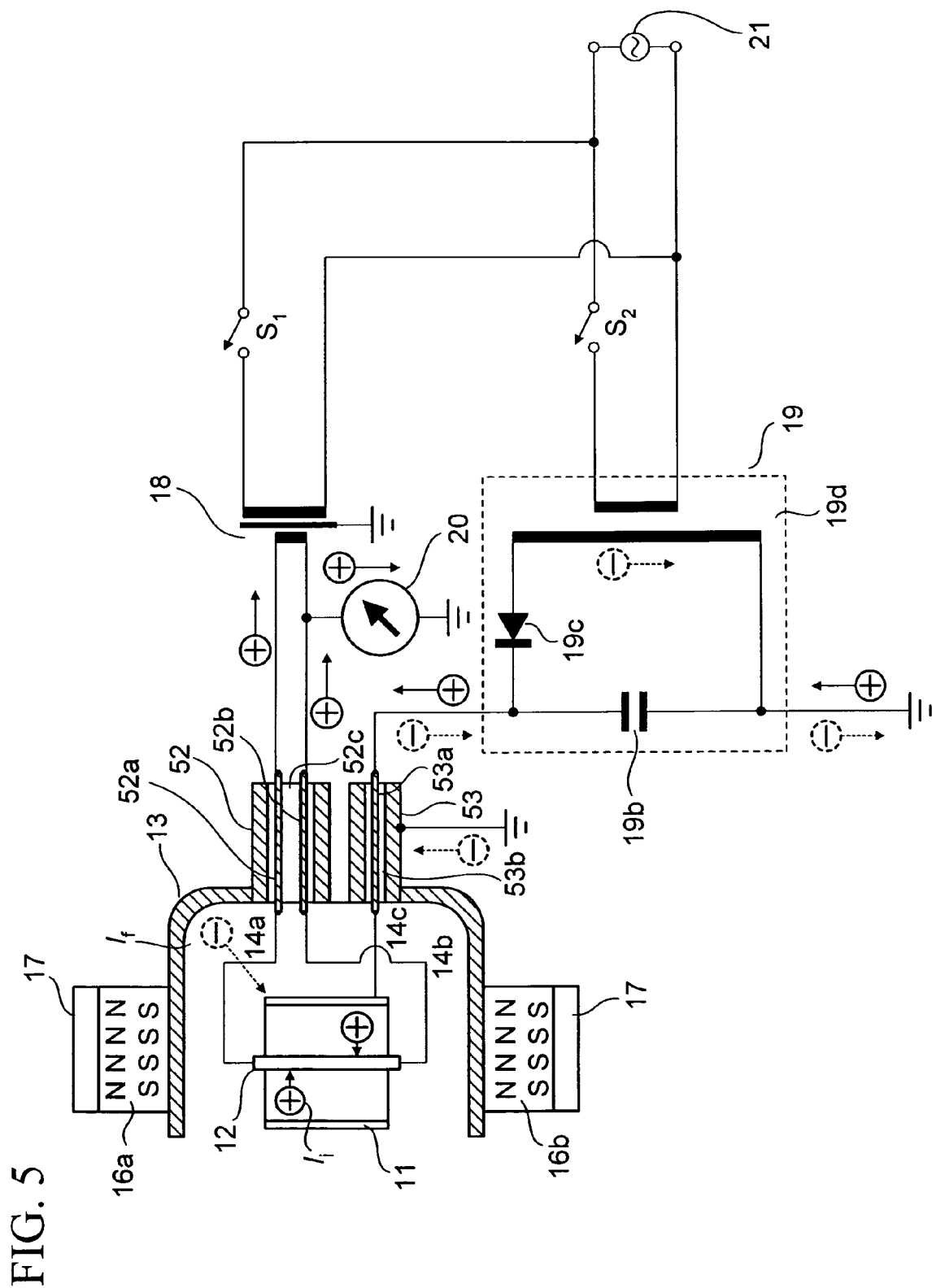
FIG. 5 a schematic view showing a magnetron type configuration of a modified example of the ionization vacuum device being the second embodiment of the present invention.

Further, the cathodes (12a, 12b) having a plate-shaped portion and the cathode 12c of the inverted U-character shaped structure are used as a cathode in the ionization vacuum devices of FIG. 1, FIG. 4 and FIG. 7, but a rod shaped cathode can be also used. For example, FIG. 3 and FIG. 5 show examples where such cathode is applied instead of the flat plate-shaped cathodes (12a, 12b) of FIG. 1 and FIG. 4. In both examples, the longitudinal direction of cathode is arranged inside a cylindrical anode along the central axis of the cylindrical anode, and they are the ionization vacuum devices used as a magnetron type cold cathode ionization vacuum gauge or as a sputter-ion pump. A connecting method to the power source 18 for heating and power source 19 for discharge, a connecting method of the electrometer 20, and operating principles, and others are the same as the embodiments of FIG. 1 and FIG. 4.

Further, in the pre-heating, electric power may be applied continuously or electric power may be applied intermittently (in pulse state).

Further, although electric power is applied intermittently (in pulse state) in the heating for starting discharge, electric power may be applied continuously.

What is claimed is:

1. An ionization vacuum device for use as a cold cathode ionization vacuum gauge, comprising:
   a vacuum vessel;
   an anode provided inside said vacuum vessel;
   a cathode provided inside said vacuum vessel;
   a power source for discharge, connected to said anode, that supplies electric power for discharge between said anode and said cathode;
   a power source for cathode-heating that is connected between terminals of said cathode and that supplies power for heating to said cathode;
   means for forming a magnetic field in a space between said anode and said cathode, with said vacuum vessel connected to another vacuum vessel to measure a pressure inside the another vacuum vessel; and
   temperature control means for controlling the heating of said cathode by said power source for cathode-heating, while creating the discharge between the anode and the cathode, so as to maintain the temperature of said cathode within a temperature range where thermonic electrons are not emitted from said cathode and whereby attachment of contaminating materials to the cathode is reduced.

2. The ionization vacuum device according to claim 1, wherein:
said anode is in a cylindrical shape, and said cathode has two plate-shaped portions each facing two opening ends of the cylinder of said anode.

3. The ionization vacuum device according to claim 1, wherein:
said anode is in a cylindrical shape, and said cathode is in a rod shape arranged so as to be partially housed inside the cylinder of said anode.

4. The ionization vacuum device according to claim 1, wherein:
the temperature range at which said cathode is heated is 200° C. or more.

5. The ionization vacuum device according to claim 1, wherein:
in said power source for discharge, a positive output terminal is connected to said anode, and a negative output terminal is connected to said cathode via grounded said vacuum vessel, and further comprising:
an electrometer that measures a current caused by discharge of gas inside said vacuum vessel is connected in series to said power source for discharge.

6. The ionization vacuum device according to claim 1, wherein:
said cathode is grounded via an electrometer that measures a current caused by discharge of gas inside said vacuum vessel, and
in said power source for discharge, a positive output terminal is connected to said anode, a negative output terminal is grounded, and said electrometer and said power source for discharge are parallelly grounded.

7. The ionization vacuum device according to claim 1, wherein:
a material of said cathode is a non-metal selected from the group of conductive ceramics, conductive oxide and graphite.

8. The ionization vacuum device according to claim 1, wherein:
a material of said cathode is a substance selected from the group consisting of titanium, tantalum, hafnium or zirconium, and alloys thereof.

9. The ionization vacuum device according to claim 1, wherein:
cells constituted of said anode and said cathode are arranged in plural numbers, the anodes of said cells being connected to each other in series or in parallel, and the cathodes of said cells being connected to each other in series or in parallel.

10. The ionization vacuum device according to claim 1, wherein:
said means for forming a magnetic field in a space between said anode and said cathode is a pair of permanent magnets placed outside said vacuum vessel while sandwiching said anode, and the pair of permanent magnets is magnetically coupled by a ferromagnet yoke to form a closed magnetic circuit.

11. The ionization vacuum device according to claim 1, wherein:
before applying said electric power for discharge between said anode and said cathode to discharge gas inside said vacuum vessel, said control means performs control so as to heat said cathode while pumping inside said vacuum vessel.

12. The ionization vacuum device according to claim 1, wherein the pressure in the another vacuum vessel correlates with discharge current and further comprising an electrometer which measures the discharge current.

13. The ionization vacuum device according to claim 1, wherein:
said anode is in a cylindrical shape, and said cathode has an inverted U-character shaped structure and is arranged such that a part of the inverted U-character shaped structure is housed inside the cylinder of said anode.

14. The ionization vacuum device according to claim 13, wherein:
said means for forming a magnetic field in a space between said anode and said cathode is a cylindrical permanent magnet placed outside said vacuum vessel, said cylindrical permanent magnet is arranged to align a central axis of the cylindrical permanent magnet with a central axis of a cylindrical shaped anode, and said cathode is arranged in the vicinity of the central axis.

15. The ionization vacuum device according to claim 13, further comprising:
a sputter-shield plate that is arranged so as to approximately cover a cylindrical opening end of said anode and on which a hole for inserting said cathode is formed, wherein:
the inverted U-character shaped structure of said cathode is inserted into the cylinder of said anode through the hole of the sputter-shield plate, and both ends of the inverted U-character shaped structure are placed under the sputter-shield plate.

16. The ionization vacuum device according to claim 15, wherein:
said sputter-shield plate is fixed to said cathode under the sputter-shield plate while maintaining electrical insulating properties with said cathode.

* * * * *